US012684969B2

(12) United States Patent
Kwon

(10) Patent No.: US 12,684,969 B2
(45) Date of Patent: Jul. 14, 2026

(54) DISPLAY DEVICE

(71) Applicant: Samsung Display Co., LTD., Yongin-si (KR)

(72) Inventor: Oh June Kwon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 85 days.

(21) Appl. No.: 18/110,026

(22) Filed: Feb. 15, 2023

(65) Prior Publication Data

US 2023/0284491 A1 Sep. 7, 2023

(30) Foreign Application Priority Data

Mar. 4, 2022 (KR) ........................ 10-2022-0028032

(51) Int. Cl.
| | |
|---|---|
| *H10K 59/131* | (2023.01) |
| *G06F 1/16* | (2006.01) |
| *H10K 59/123* | (2023.01) |
| *H10K 102/00* | (2023.01) |

(52) U.S. Cl.
CPC ......... *H10K 59/131* (2023.02); *G06F 1/1616* (2013.01); *G06F 1/1652* (2013.01); *H10K 59/123* (2023.02); *H10K 2102/311* (2023.02)

(58) Field of Classification Search
CPC .............................. H10K 59/131; H10K 59/82
See application file for complete search history.

(56) References Cited

U.S. PATENT DOCUMENTS

| | | | |
|---|---|---|---|
| 9,627,637 | B2 | 4/2017 | Kwon |
| 10,162,386 | B2 * | 12/2018 | Chong ................... H04N 23/62 |
| 10,777,756 | B2 * | 9/2020 | Lee .......................... G09F 9/301 |
| 2016/0343964 | A1 | 11/2016 | Kwon |
| 2019/0261512 | A1 * | 8/2019 | Huang ...................... G09F 9/33 |

FOREIGN PATENT DOCUMENTS

| | | |
|---|---|---|
| CN | 106782088 | 5/2017 |
| KR | 10-2017-0005281 | 1/2017 |
| KR | 10-2019-0069062 | 6/2019 |

* cited by examiner

*Primary Examiner* — Minsun O Harvey
*Assistant Examiner* — Alexander Ehrlich
(74) *Attorney, Agent, or Firm* — CANTOR COLBURN LLP

(57) ABSTRACT

A display device includes a substrate including a main portion, a first edge portion protruding from the main portion in a first direction, and a second edge portion protruding from the main portion in the first direction and spaced apart from the first edge portion in the first direction, a first data line disposed on the main portion and extending in a second direction intersecting the first direction, a second data line including a first portion disposed on the first edge portion and extending in the second direction, and a second portion disposed on the second edge portion and extending in the second direction, and a connection line electrically connecting the first portion of the second data line and the second portion of the second data line to each other. The first data line and the second data line, and the connection line are disposed on different layers.

19 Claims, 21 Drawing Sheets

DA: FS, EG, FA, G
EG: EG1, EG2, EG3, EG4
FS: FS1, FS2
G: G1, G2

DA: FS, EG, FA, G
EG: EG1, EG2, EG3, EG4
FS: FS1, FS2
G: G1, G2

DA: FS, EG, FA, G
EG: EG1, EG2, EG3, EG4
FS: FS1, FS2
G: G1, G2

FL: FL1, FL2
BL: BL1, BL2, BL3, BL4

DA: FS1, FS2, EG1, EG2, FA

DA: FS1, FS2, FA, EG1, EG2, EG3, EG4

DA: FS1, FS2, FA, EG1, EG2, EG3, EG4

DA: FS1, FS2, EG1, EG2, EG3, EG4, FA

DA: FS1, FS2, EG1, EG2, EG3, EG4, FA

DA: FS, EG, FA, G
EG: EG1, EG2, EG3, EG4
FS: FS1, FS2
G: G1, G2
DL1: DL1_a, DL1_b
DL2: DL2_a, DL2_b
CL1: CL1_a, CL1_b, CL1_c
CL2: CL2_a, CL2_b, CL2_c

DL1: DL1_a, DL1_b
DL2: DL2_a, DL2_b
CL1: CL1_a, CL1_b, CL1_c
CL2: CL2_a, CL2_b, CL2_c
DA: FS1, FS2, FA, EG1, EG2

CL1: CL1_a, CL1_b, CL1_c
DL1: DL1_a, DL1_b

CL1: CL1_a, CL1_b, CL1_c
DL1: DL1_a, DL1_b

CL1: CL1_a, CL1_b, CL1_c
DL1: DL1_a, DL1_b

CL1: CL1_a, CL1_b, CL1_c
DL1: DL1_a, DL1_b

DISPLAY DEVICE

CROSS-REFERENCE TO RELATED APPLICATION

This application claims priority to and benefit of Korean Patent Application No. 10-2022-0028032 under 35 U.S.C. 119, filed on Mar. 4, 2022, in the Korean Intellectual Property Office (KIPO), the contents of which are incorporated by reference in its entirety.

BACKGROUND

1. Technical Field

The disclosure relates to a display device with a display panel having an edge portion that may be folded.

2. Description of the Related Art

With the recent technological development of display devices, flexible display panels that may be folded or rolled are being developed. A display device including such a flexible display panel has an advantage that it may be deformed into a preset shape or may be deformed into various shapes according to a user's request.

A flexible display device with a pixel array layer including thin film transistors and lines formed on a flexible substrate may display images even when bent or folded, and thus may be utilized in various fields. The flexible display device may be classified into a curved display device with the display device bent to a curvature or a foldable display device with the display device folded inwardly or outwardly, and the like.

SUMMARY

Aspects of the disclosure provide a display device with a display panel having an edge portion that may be folded and that may provide an image even from the edge portion by electrically connecting data lines disconnected by a concave portion through connection lines.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a substrate including a main portion, a first edge portion protruding from the main portion in a first direction, and a second edge portion protruding from the main portion in the first direction and spaced apart from the first edge portion in the first direction, a first data line disposed on the main portion and extending in a second direction, a second data line including a first portion disposed on the first edge portion and extending in the second direction, and a second portion disposed on the second edge portion and extending in the second direction, and a connection line electrically connecting the first portion of the second data line and the second portion of the second data line to each other. The first data line and the second data line, and the connection line may be disposed on different layers.

In an embodiment, the main portion may include a first flat portion, a second flat portion spaced apart from the first flat portion in the second direction, and a folding portion disposed between the first flat portion and the second flat portion. The first data line may be continuously disposed on the main portion, and the connection line may overlap at least a portion of the first data line in a thickness direction.

In an embodiment, the connection line may include a first portion extending in a third direction intersecting the first direction and the second direction, a second portion extending in the second direction from an end portion of the first portion of the connection line, and a third portion extending from an end portion of the second portion of the connection line in a fourth direction intersecting the first direction and the second direction. The first portion of the connection line may be electrically connected to the first portion of the second data line, and the third portion of the connection line may be electrically connected to the second portion of the second data line.

In an embodiment, the first portion of the connection line may be disposed on the first edge portion and the first flat portion, at least a portion of the second portion of the connection line may be disposed on the folding portion, and the third portion of the connection line may be disposed on the second flat portion and the second edge portion.

In an embodiment, the display device may further include a pixel disposed on the substrate and including a first electrode, a second electrode overlapping at least a portion of the first electrode in a thickness direction, and a light emitting layer disposed between the first electrode and the second electrode, a thin film transistor electrically connected to the first electrode by a first connection electrode, and a first insulating layer, a second insulating layer, and a third insulating layer, each disposed between the substrate and the first electrode. The first portion of the second data line and the second portion of the second data line may be disposed on the third insulating layer.

In an embodiment, the connection line and the first electrode may be disposed on the first insulating layer, and the connection line and the first electrode may include a same material.

In an embodiment, the connection line and the first connection electrode may be disposed on the second insulating layer, and the connection line and the first connection electrode may include a same material.

In an embodiment, the display device may further include a second connection electrode and a third connection electrode disposed on the second insulating layer. The connection line may be electrically connected to the second data line through the second connection electrode and the third connection electrode.

In an embodiment, the display device may further include an electrode layer overlapping a gate electrode of the thin film transistor in the thickness direction, and a fourth insulating layer disposed between the gate electrode and the electrode layer.

In an embodiment, the connection line may be disposed on the fourth insulating layer, and the connection line and the electrode layer may include a same material.

In an embodiment, the folding portion may not interfere with the first edge portion and the second edge portion in case that the substrate is in-folded.

In an embodiment, the substrate may further include a third edge portion spaced apart from the first edge portion in the first direction, and a fourth edge portion spaced apart from the second edge portion in the first direction. The first flat portion may be disposed between the first edge portion and the third edge portion, and the second flat portion may be disposed between the second edge portion and the fourth edge portion.

In an embodiment, in case that the substrate is in-folded, the first flat portion, the second flat portion, and the folding portion may be not exposed to the outside, and the first edge portion, the second edge portion, the third edge portion, and the fourth edge portion may be exposed to the outside.

In an embodiment, in case that the substrate is out-folded, the first flat portion, the second flat portion, the folding portion, the first edge portion, the second edge portion, the third edge portion, and the fourth edge portion may be exposed to the outside.

According to another embodiment of the disclosure, a display may include a substrate including a first flat portion, a second flat portion spaced apart from the first flat portion in a first direction intersecting a second direction, a folding portion disposed between the first flat portion and the second flat portion, a first edge portion protruding from the first flat portion in the second direction, and a second edge portion protruding from the second flat portion in the second direction and spaced apart from the first edge portion in the first direction, a first data line continuously disposed on the first flat portion, the folding portion, and the second flat portion and extending in the first direction, a second data line including a first portion disposed on the first edge portion and extending in the first direction, and a second portion disposed on the second edge portion and extending in the first direction, and a first connection line electrically connecting the first portion of the second data line and the second portion of the second data line to each other. The first connection line may overlap the first data line in the first flat portion and the second flat portion in a thickness direction, and the first connection line may not overlap the first data line in the folding portion in the thickness direction.

In an embodiment, the first connection line may be disposed on a different layer from the first data line and the second data line.

In an embodiment, the display device may further include a third data line including a first portion disposed on the first edge portion and extending in the first direction and a second portion disposed on the second edge portion and extending in the first direction, a second connection line electrically connecting the first portion of the third data line and the second portion of the third data line to each other, and a fourth data line continuously disposed on the first flat portion, the folding portion, and the second flat portion and extending in the first direction.

In an embodiment, the first connection line and the second connection line may be disposed on a same layer, and the first connection line and the second connection line may be disposed on different layers from the first data line, the second data line, the third data line, and the fourth data line.

In an embodiment, in the first flat portion and the second flat portion, each of the first connection line and the second connection line may overlap at least one of the third data line and the fourth data line in the thickness direction.

In an embodiment, in the folding portion, the first data line, the first connection line, the second connection line, and the fourth data line may not overlap each other in the thickness direction.

According to an embodiment, a folding portion defined by folding lines may not overlap bending area bent from bending line intersecting the folding lines. As a result, even in case that the flexible display device is folded in the folding portion, cracks may be prevented from occurring in the bending area bent from the bending line intersecting the folding lines.

Since an image may be displayed to the user even through the edge portion, it may be recognized that an image is displayed on an entire area of the display device to the user in case that the display device is folded outwardly.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
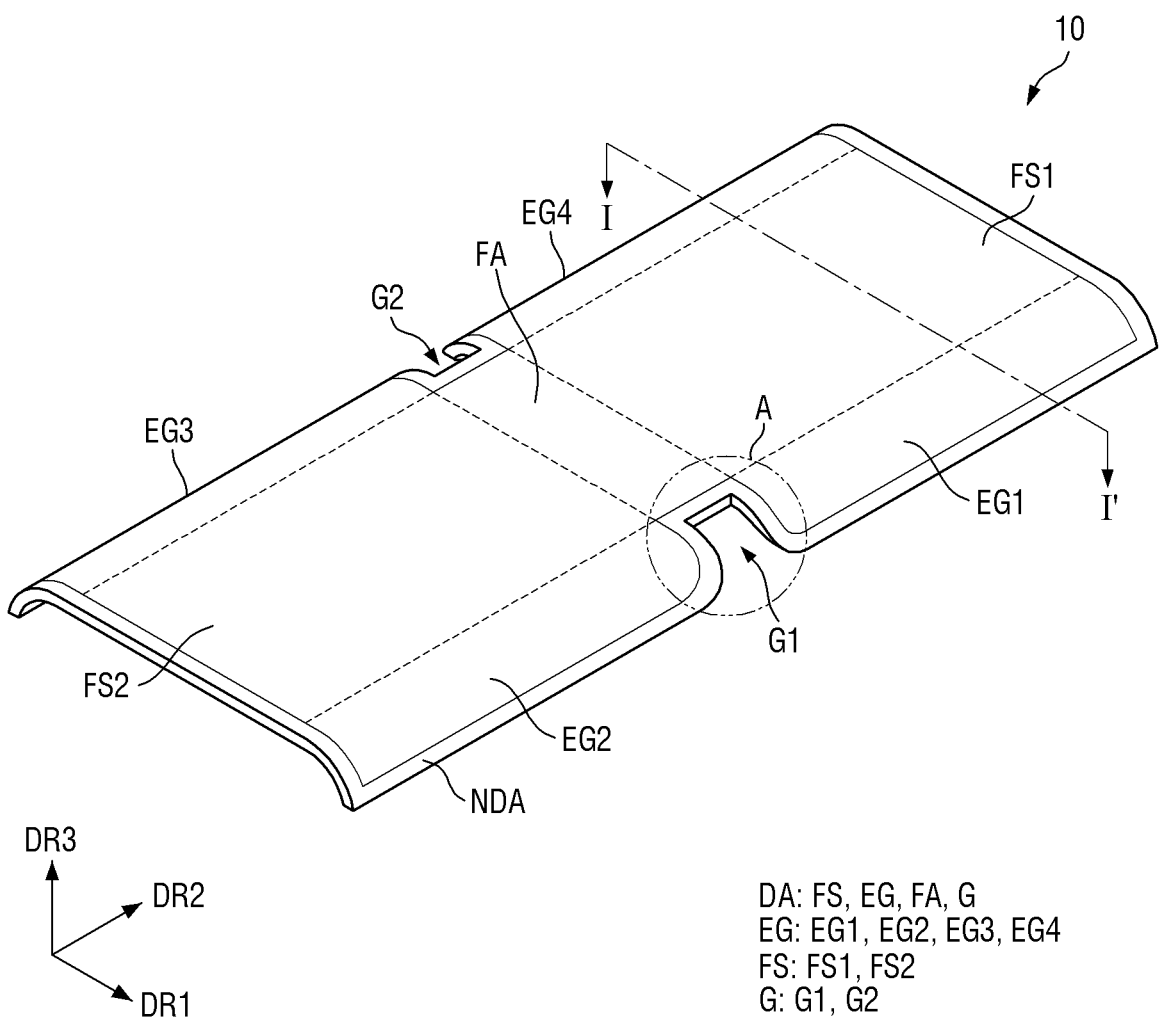
FIG. 1 is a perspective view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terms "above," "top" and "top surface" as used herein refer to an upward direction (i.e., a Z-axis direction) with respect to the display device. The terms "below," "bottom" and "bottom surface" as used herein refer to a downward direction (i.e., a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings.

Figure 2:
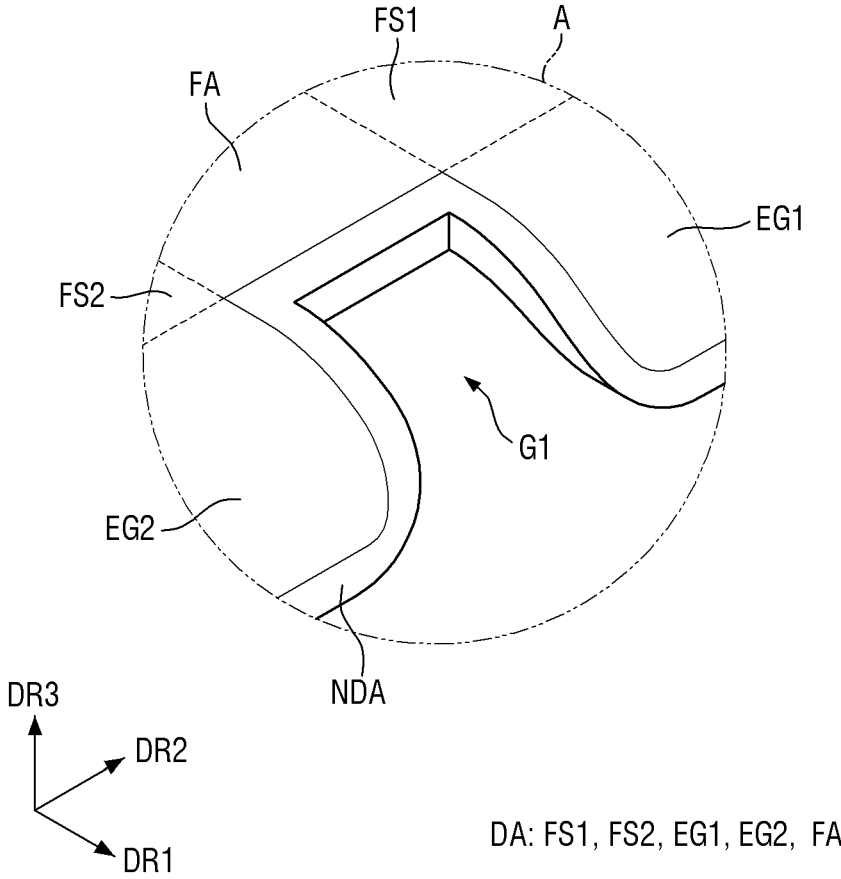
FIG. 2 is an enlarged view of area A illustrated in FIG. 1.

FIG. 1 is a perspective view of a display device according to an embodiment. FIG. 2 is an enlarged view of area A illustrated in FIG. 1.

Referring to FIG. 1, a display device 10 according to an embodiment may display a screen or an image through a display area DA, and various devices including the display area DA may be included therein. For example, the display device 10 according to embodiments of the specification may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, car navigation systems, vehicle instrument boards, digital cameras, camcorders, external billboards, electric signs, medical devices, inspection devices, various home appliances such as refrigerators and washing machines, or Internet of Things (IoT) devices.

FIG. 1 is a view illustrating an unfolded state of the display device 10 according to an embodiment. In the unfolded state, short sides of the display device 10 in a plan view may extend in a first direction DR1, and long sides of the display device 10 in a plan view may extend in a second direction DR2. For example, the first direction DR1 and the second direction DR2 may intersect to be perpendicular to each other, and the first direction DR1 may be a horizontal direction of the display device 10 in a plan view, and the second direction DR2 may be a vertical direction of the display device 10 in a plan view.

The display device 10 may include a display area DA and a non-display area NDA.

The display area DA may be an area including multiple pixels to display an image. The pixels may have a rectangular shape, a rhombus shape, or a square shape in a plan view, but are not limited thereto. For example, the pixels may have other quadrangular shapes other than the rectangular shape, the rhombus shape, or the square shape, a polygonal shape other than the quadrangular shape, a circular shape, or an elliptical shape.

The non-display area NDA may be an area that does not include the pixels and does not display the image. The non-display area NDA may be disposed adjacent to the display area DA, and the display area DA may be at least partially surrounded by the non-display area NDA.

Signal lines or a scan driver for driving pixels or light emitting areas may be disposed in the non-display area NDA, and the non-display area NDA may constitute a bezel area of the display device 10.

A detailed description of various signal lines or a scan driver 200 (see FIG. 11) disposed in the non-display area NDA will be described later with reference to FIG. 11.

The display area DA may include a flat portion FS (FS1 and FS2), an edge portion EG (EG1, EG2, EG3, and EG4), and a folding portion FA.

The flat portion FS may include a first flat portion FS1 and a second flat portion FS2. In some embodiments, the first flat portion FS1 may be positioned on a side of the folding portion FA in the second direction DR2, and the second flat portion FS2 may be positioned on another side of the folding portion FA in the second direction DR2. In some embodiments, the first flat portion FS1 and the second flat portion FS2 may be substantially flat, but are not limited thereto, and may have a convex or concave shape in a thickness direction (or a third direction DR3) in at least some areas. In some embodiments, the first flat portion FS1 and the second flat portion FS2 may have a rectangular shape having short sides in the first direction DR1 and long sides in the second direction DR2.

The edge portion EG may include a first edge portion EG1, a second edge portion EG2, a third edge portion EG3, and a fourth edge portion EG4. For example, the first edge portion EG1 and the fourth edge portion EG4 may be disposed to be spaced apart from each other in the first direction DR1 with the first flat portion FS1 interposed therebetween.

The second edge portion EG2 and the third edge portion EG3 may be disposed to be spaced apart from each other in the first direction DR1 with the second flat portion FS2 interposed therebetween.

Accordingly, each of the first edge portion EG1 and the fourth edge portion EG4 may extend in the first direction DR1 from the first flat portion FS1 and may be positioned on both sides of the display device 10, and each of the second edge portion EG2 and the third edge portion EG3 may extend in the first direction DR1 from the second flat portion FS2 and may be positioned on both sides of the display device 10, such that an image may also be provided to the user from the side surfaces of the display device 10.

For example, the first edge portion EG1 and the second edge portion EG2 may be positioned in a right area of the display device 10, and the third edge portion EG3 and the fourth edge portion EG4 may be positioned in a left area of the display device 10. However, the position of the edge portion EG is not limited thereto.

In some embodiments, the edge portion EG may have a curved shape having a predetermined or selectable curvature. The edge portion EG may have a flat shape partially extending in the second direction DR2.

For example, the first edge portion EG1 may be bent with an angle greater than or equal to 90 degrees and less than 180 degrees from the first flat portion FS1. For example, an angle between a lower surface of the first flat portion FS1 and a lower surface of the first edge portion EG1 extending from the first flat portion FS1 in the first direction DR1 may be greater than or equal to 90 degrees and less than 180 degrees.

For example, in case that the angle between the lower surface of the first flat portion FS1 and the lower surface of the first edge portion EG1 is 90 degrees, the lower surface of the first edge portion EG1 may be perpendicular to the lower surface of the first flat portion FS1, and in case that the angle between the lower surface of the first flat portion FS1 and the lower surface of the first edge portion EG1 is 180 degrees, the lower surface of the first flat portion FS1 and the lower surface of the first edge portion EG1 may be positioned on a same line in the first direction DR1 and may be horizontal.

Accordingly, in order to provide an image to the user from the edge portion EG of the display device 10 folded inwardly or outwardly, the angle between the lower surface of the first flat portion FS1 and the lower surface of the first edge portion EG1 may be greater than or equal to 90 degrees and less than 180 degrees.

The first edge portion EG1, the second edge portion EG2, the third edge portion EG3, and the fourth edge portion EG4 may have substantially the same function or configuration except for positions thereof.

The folding portion FA may be positioned between the first flat portion FS1 and the second flat portion FS2 in a plan view. In some embodiments, the folding portion FA may overlap the first flat portion FS1 and the second flat portion FS2 of the display device 10 in the second direction DR2 or may be coplanar with the first and second flat portions FS1 and FS2 in an unfolded state. The folding portion FA may have long sides in the first direction DR1 and short sides in the second direction DR2. The folding portion FA may not be disposed on the edge portion EG. However, the disclosure is not limited thereto.

Referring to FIGS. 1 and 2, the display device 10 may include concave portions G in a right area (a side) in which the edge portions EG and the folding portion FA do not overlap in the second direction DR2, and a left area (another side) in which the edge portions EG and the folding portion FA do not overlap in the second direction DR2. Each of the edge portions EG and each corresponding one of the folding portion DA may not interfere with each other due to the concave portions G in case that the display device 10 is in-folded. The concave portion G may be an area from which a display panel 100 (see, e.g., FIG. 11) is removed, and may be defined by an end portion of a side of the non-display area NDA of the folding portion FA and end portions of sides of the non-display areas NDA of the edge portions EG spaced apart from each other in the second direction DR2 of the display device 10.

For example, the concave portions G, which are the areas recessed from the edge portions EG positioned on a side of the flat portions FS and the folding portion FA, and the non-display areas NDA of the edge portions EG of the display device 10 in the first direction DR1, may be formed by cutting the display panel 100.

For example, a first concave portion G1 may be disposed between the first edge portion EG1 and the second edge portion EG2 in the second direction DR2, and a second concave portion G2 may be disposed between the third edge portion EG3 and the fourth edge portion EG4 in the second direction DR2.

For example, as illustrated in FIG. 2, the first edge portion EG1 and the second edge portion EG2 may be disposed to extend in the second direction DR2 with respect to the first concave portion G1 and be separated from each other, and the third edge portion EG3 and the fourth edge portion EG4 may be disposed to extend in the second direction DR2 with respect to the second concave portion G2 and be separated from each other.

As such, in case that the display device 10 may be folded inwardly or outwardly, the edge portions EG may be folded without overlapping the folding portion FA because the concave portions G is disposed between the edge portions EG.

Figure 3:
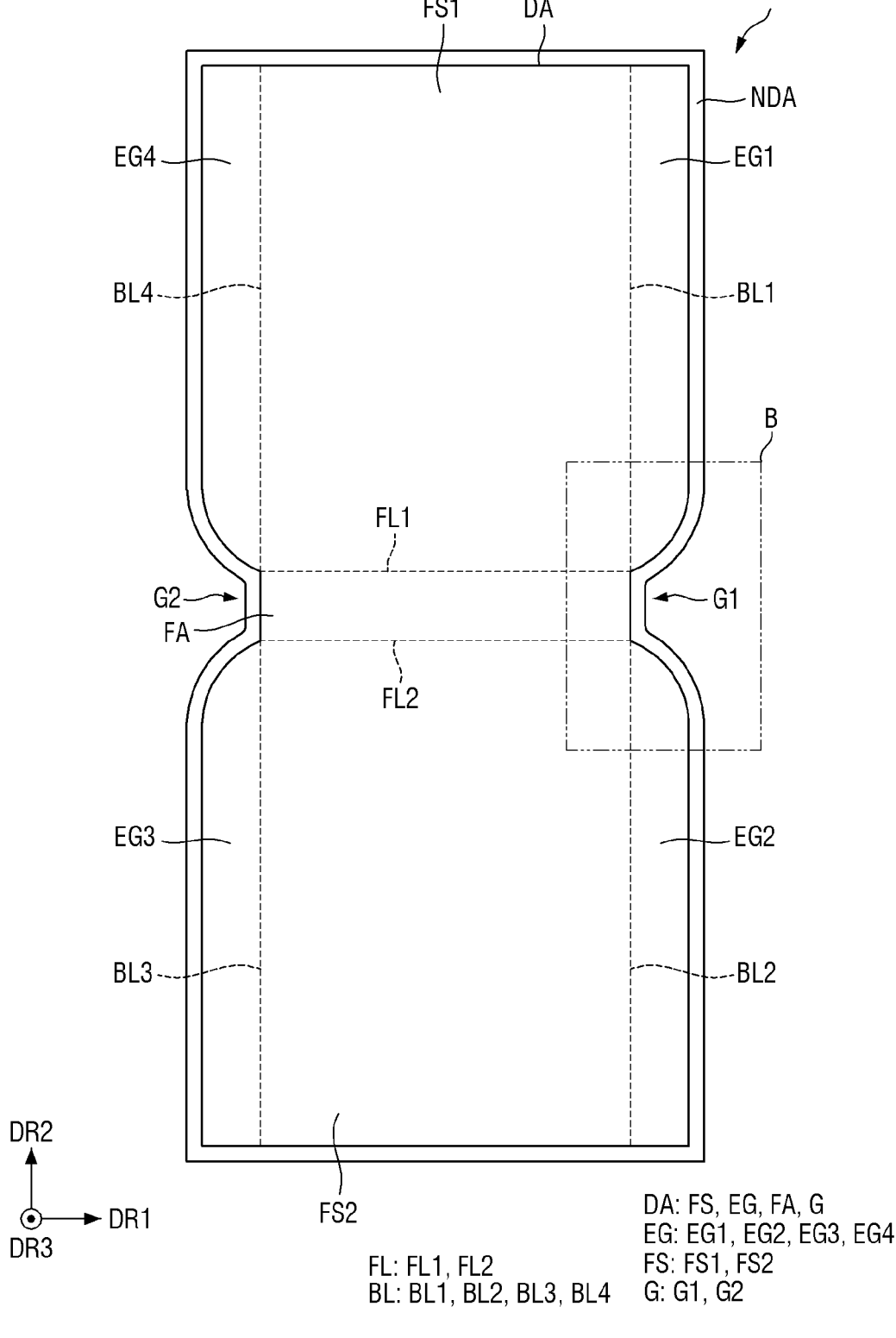
FIG. 3 is a plan view of the display device according to an embodiment.
Figure 4:
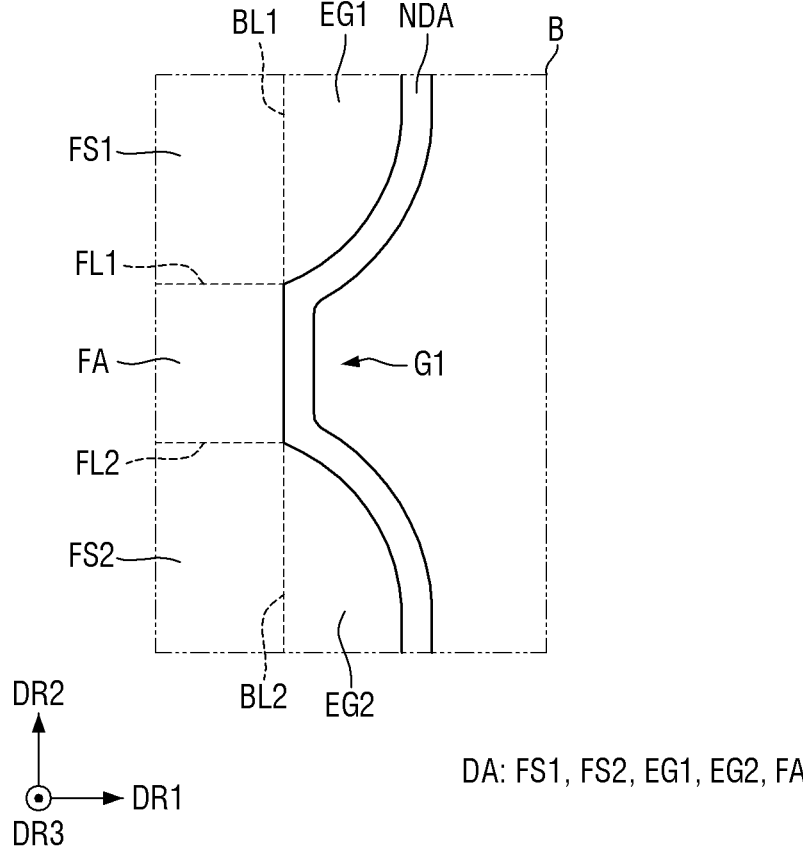
FIG. 4 is an enlarged view of area B illustrated in FIG. 3.

FIG. 3 is a plan view of the display device according to an embodiment. FIG. 4 is an enlarged view of area B illustrated in FIG. 3.

Referring to FIGS. 3 and 4, the display device 10 may include the flat portions FS (FS1 and FS2), the edge portions EG (EG1, EG2, EG3, and EG4) bent in the first direction DR1 along one or more bending lines BL (BL1, BL2, BL3, and BL4), and the folding portion FA that may be folded along folding lines FL (FL1 and FL2).

The bending line BL may be a boundary between the flat portion FS and the edge portion EG. For example, the bending line BL may be a boundary at which the edge portion EG extends in the first direction DR1 from the edge of the flat portion FS and is bent downwardly with a predetermined (or selectable) curvature. For example, the first bending line BL1 may be a boundary between the first flat portion FS1 and the first edge portion EG1. The first bending line BL1, the second bending line BL2, the third bending line BL3, and the fourth bending line BL4 may have substantially the same function or configuration except for positions thereof.

The folding line FL may be a boundary between the flat portion FS and the folding portion FA. For example, the folding line FL may be a boundary dividing an area between the flat portion FS and the folding portion FA in the state in which the display device 10 is folded inwardly or outwardly. For example, the first folding line FL1 may be a boundary dividing an area between the first flat portion FS1 positioned on an upper side of the folding portion FA and the folding portion FA. The first folding line FL1 and the second folding line FL2 may have substantially the same function or configuration except for positions thereof.

In FIG. 3, it is illustrated that the display device 10 includes four edge portions EG (EG1, EG2, EG3, and EG4) and one folding portion FA, but the disclosure is not limited thereto, and the number of the edge portions EG and the number of the folding portions FA are not limited to the embodiment illustrated in FIG. 3.

The edge portions EG (EG1, EG2, EG3, and EG4) may be areas bent along the bending lines BL (BL1, BL2, BL3, and BL4). A side surface of each of the edge portions EG (EG1, EG2, EG3, and EG4) may include a round shape in a plan view, but is not limited thereto.

For example, the first edge portion EG1, the second edge portion EG2, the third edge portion EG3, and the fourth edge portion EG4 may extend from edge portions of the flat portions FS (FS1 and FS2) to have a predetermined (or selectable) curvature and may include a round shape. For example, the first edge portion EG1 may have a first curvature, the second edge portion EG2 may have a second curvature, the third edge portion EG3 may have a third curvature, and the fourth edge portion EG4 may have a fourth curvature. At least one of the first curvature, the second curvature, the third curvature, and the fourth curvature may have a different curvature.

The folding portion FA may be an area defined by the first folding line FL1, the second folding line FL2, and the bending lines BL. The display device 10 may be folded along each of the first folding line FL1 and the second folding line FL2.

In an embodiment, the folding portion FA of the display device 10 may be disposed at a specific position. For example, the folding portion FA may be disposed between the first flat portion FS1 and the second flat portion FS2 in a plan view. However, the folding portion FA is not limited thereto, and the position thereof in the display device 10 is not specified and may also be freely set in various areas.

Referring to FIGS. 3 and 4, intersecting points of the bending lines BL and the folding lines FL may be positioned at respective vertices of the folding portion FA defined by the folding lines FL and the bending lines BL.

For example, the folding lines FL of the display device 10 may be positioned on the inside compared to the bending lines BL. For example, a distance between outer edges of the folding area in the first direction DR1 may be smaller than a distance between an outer edge of the first edge portion EG1 and an outer edge of the fourth edge portion EG4 in the first direction. The first folding line FL1 may intersect the first bending line BL1 and the fourth bending line BL4, the second folding line FL2 may intersect the second bending line BL2 and the third bending line BL3, and the folding lines FL may be positioned on the inside compared to the bending lines BL.

Accordingly, in case that the folding lines FL are positioned on the inside compared to the bending lines BL, the edge portions EG and the folding portion FA may not overlap each other because of the concave portion G, and cracks may be prevented from occurring due to overlapping of the edge portions EG and the folding portions FA in case that the display device 10 is folded inwardly or outwardly.

Figure 5:
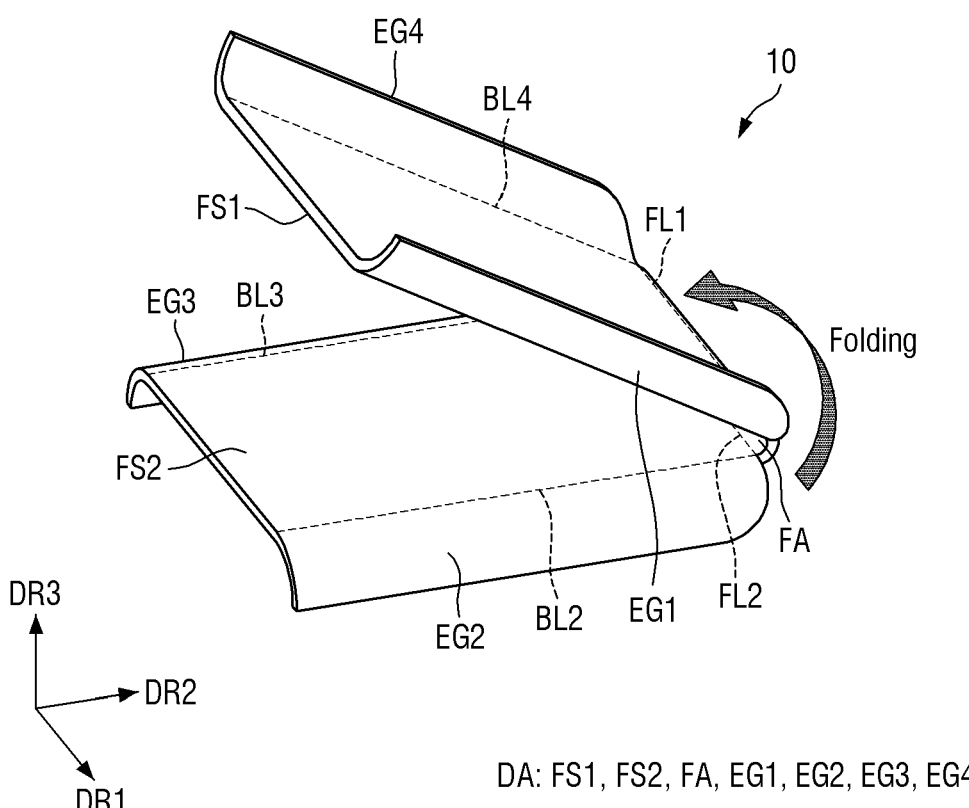
FIG. 5 is a perspective view illustrating the display device according to an embodiment illustrating a state of being folded inwardly.
Figure 6:
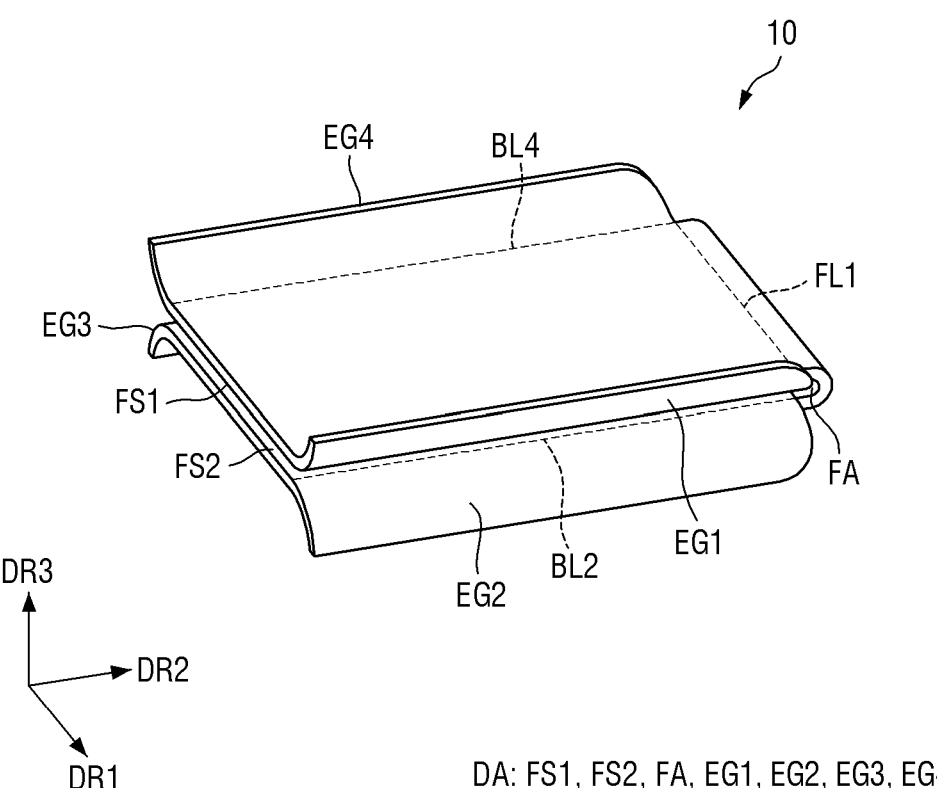
FIG. 6 is a perspective view illustrating the display device according to an embodiment that is folded inwardly.
Figure 7:
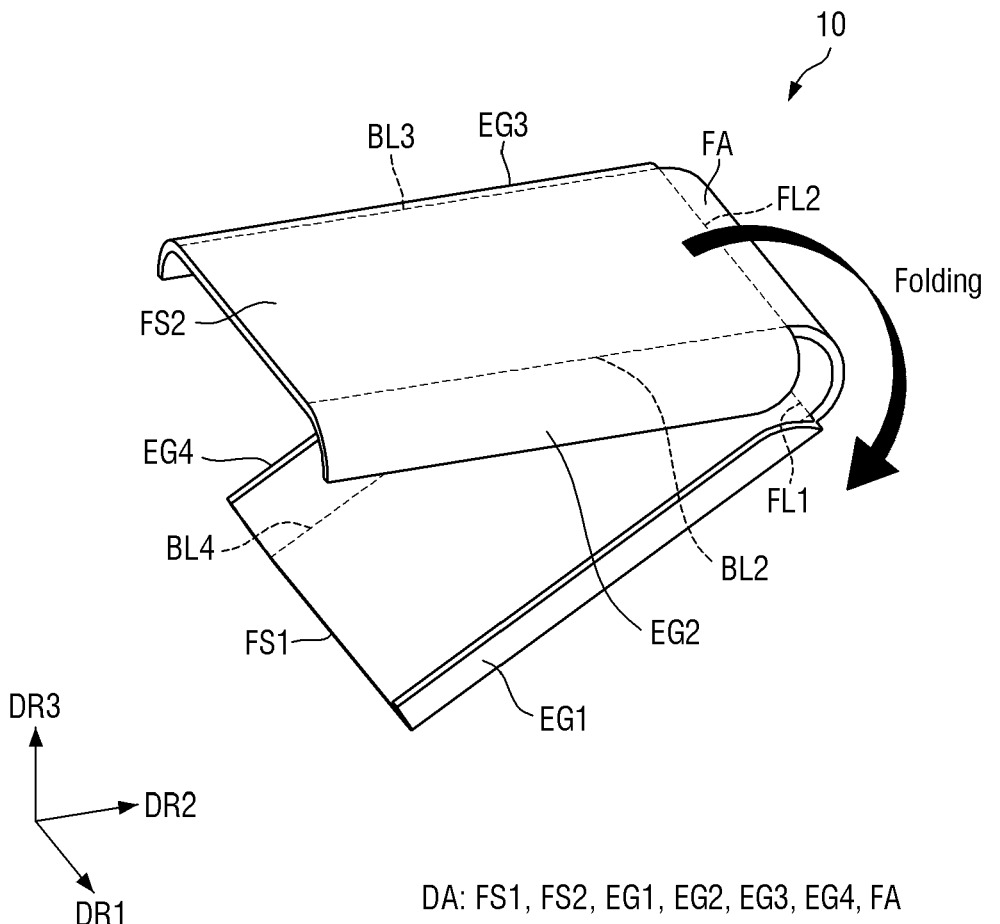
FIG. 7 is a perspective view illustrating the display device according to an embodiment illustrating a state of being folded outwardly.
Figure 8:
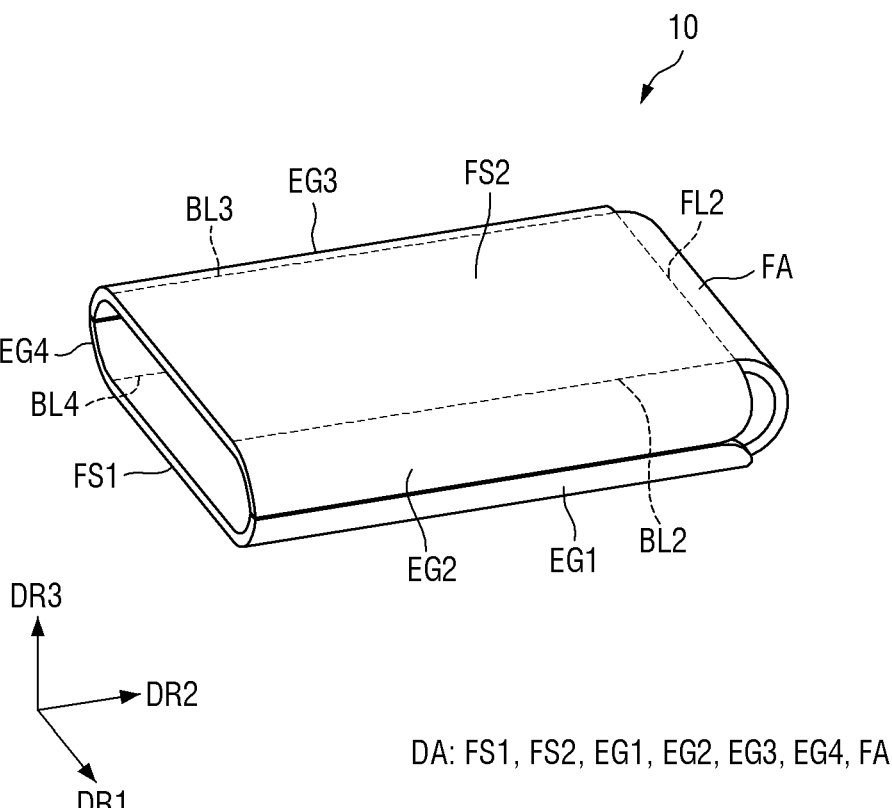
FIG. 8 is a perspective view illustrating the display device according to an embodiment that is folded outwardly.

FIG. 5 is a perspective view illustrating the display device according to an embodiment illustrating a state of being folded inwardly. FIG. 6 is a perspective view illustrating the display device according to an embodiment that is folded inwardly. FIG. 7 is a perspective view illustrating the display device according to an embodiment illustrating a state of being folded outwardly. FIG. 8 is a perspective view illustrating the display device according to an embodiment that is folded outwardly.

Referring to FIGS. 5 and 6, the display device 10 may be folded inwardly along the first folding line FL1 and the second folding line FL2 in the second direction DR2 while the first edge portion EG1, the second edge portion EG2, the third edge portion EG3, and the fourth edge portion EG4 do not overlap the folding portion FA as described above.

For example, referring to FIGS. 5 and 6, in case that the display device 10 is folded inwardly such that the display area DA is disposed inside, top surfaces of the display device 10 may face each other.

For example, in case that the display device 10 is folded inwardly, the first flat portion FS1 and the second flat portion FS2 may oppose each other, and the first edge portion EG1 and the second edge portion EG2 positioned on a side of the display device 10 and the third edge portion EG3 and the fourth edge portion EG4 positioned on another side thereof may oppose each other and may be exposed to the outside. However, the disclosure is not limited thereto, and in some embodiments, the first flat portion FS1 and the second flat portion FS2 may oppose each other and may contact each other.

Accordingly, in case that the display device 10 is in-folded, the display area DA of the first flat portion FS1 and the second flat portion FS2 may not display an image, or the image may not be recognized by a user even if the display area DA of the first flat portion FS and the second flat portion FS2 displays an image. As a result, in the in-folded state, an image may be displayed in the display area DA of the first edge portion EG1, the second edge portion EG2, the third edge portion EG3, and the fourth edge portion EG4 except for the display area DA of the first flat portion FS1 and the second flat portion FS2 and may be provided to the user.

Referring to FIGS. 7 and 8, the display device 10 according to another embodiment may be folded outwardly along the first folding line FL1 and the second folding line FL2 in the second direction DR2 while the first edge portion EG1, the second edge portion EG2, the third edge portion EG3, and the fourth edge portion EG4 do not overlap the folding portion FA.

For example, in case that the display device 10 is folded outwardly such that the first flat portion FS1 and the second flat portion FS2 are disposed outside, bottom surfaces of the display device 10 opposite to the top surfaces of the display device 10 may face each other.

For example, each of the first flat portion FS1 and the second flat portion FS2 may be exposed to the outside, and the folding portion FA disposed between the first flat portion FS1 and the second flat portion FS2 may also be exposed to the outside.

Accordingly, in the state in which the display device 10 is folded outwardly, an image may be provided to the user without distinguishing between the top surface and the bottom surface of the display device 10 from the display area DA of each of the first flat portion FS1 and the second flat portion FS2, and an image may also be provided to the user from side surfaces of the display device 10 from the display area DA while end portions of the bottom surfaces of the first edge portion EG1 and the second edge portion EG2 disposed on a side of the display device 10 and end portion of the bottom surfaces of the third edge portion EG3 and the fourth edge portion EG4 disposed on another side of the display device 10 contacting each other and extending from the first flat portion FS1 and the second flat portion FS2.

Since an image may be provided to the user even from the folding portion FA disposed between the first flat portion FS1 and the second flat portion FS2, it may be recognized that the image is displayed to the user from the entire area of the display device 10.

Therefore, since no bezel may be recognized by the user, a more immersive screen may be provided, and since a length of the display device 10 in the second direction DR2 may be reduced by about half, it may be convenient for the user to carry the display device 10.

Figure 9:
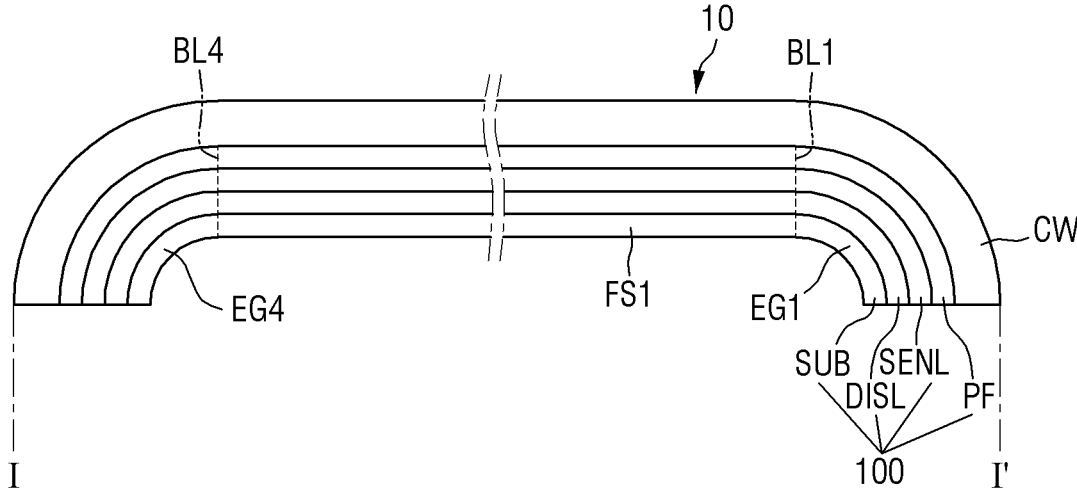
FIG. 9 is a schematic cross-sectional view illustrating an embodiment of the display device taken along line I-I' of FIG. 1.
Figure 9:
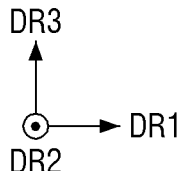

FIG. 9 is a schematic cross-sectional view illustrating an embodiment of the display device taken along line I-I' of FIG. 1. For the convenience of description, the non-display area is omitted.

Referring to FIG. 9, the display device 10 according to an embodiment may include a display panel 100. In some embodiments, the display device 10 may further include a cover window CW.

The display panel 100 may include a substrate SUB and a display layer DISL. However, the display panel 100 is not limited thereto, and in some embodiments, the display panel 100 may further include a sensor electrode layer SENL and a polarizing layer PF.

The display panel 100 may be a panel that displays a screen or an image. Examples of the display panel 100 may include a light-receiving display panel such as a liquid crystal display panel (LCD) and an electrophoretic display panel (EPD), as well as a self-light emitting display panel such as an organic light emitting display panel (OLED), an inorganic light emitting display panel (inorganic EL), a quantum dot light emitting display panel (QED), micro LED display panel (micro-LED), a nano LED display panel (nano-LED), a plasma display panel (PDP), a field emission display panel (FED), and a cathode ray display panel (CRT).

Hereinafter, the organic light emitting display panel will be described as an embodiment of the display panel 100, and the organic light emitting display panel applied to the embodiment will be simply abbreviated as the display panel 100 unless a special distinction is required. However, the embodiment is not limited to the organic light emitting display panel, and other display panels 100 listed above or known in the technical field may be applied within the scope of the technical idea.

The substrate SUB may include a flexible substrate that may be bent, folded, rolled, and stretched.

In some embodiments, the substrate SUB may include glass or a polymer resin. The polymer resin may include polyethersulfone (PES), polyarylate (PAR), polyetherimide (PEI), polyacrylate, polyethylene naphthalate (PEN), polyethylene terephthalate, polyphenylene sulfide (PPS), polyimide (PI), polycarbonate (PC), cellulose triacetate (TAC), cellulose acetate propionate (CAP), or the like.

A display layer DISL may be disposed on the substrate SUB. The display layer DISL may include a display area DA and a non-display area NDA. In the display area DA of the display layer DISL, light emitting elements, and scan lines, data lines, power voltage lines, and the like for driving the light emitting devices may be disposed.

In the non-display area NDA of the display layer DISL, a scan driver outputting scan signals to the scan lines, and fan-out lines electrically connecting the data lines and the display driving circuit may be disposed.

Detailed descriptions of the scan lines, the data lines, the power voltage lines, the scan driver, and the display driving circuit will be described later with reference to FIGS. 10 and 11.

The display layer DISL may include a thin film transistor layer in which thin film transistors are formed, a light emitting element layer in which light emitting elements emitting light are disposed in light emitting areas, and an encapsulation layer for encapsulating the light emitting element layer.

A sensor electrode layer SENL may be disposed on the display layer DISL. The sensor electrode layer SENL may include sensor electrodes. The sensor electrode layer SENL may detect a touch of a person or an object using the sensor electrodes.

A polarizing layer PF may be disposed on the sensor electrode layer SENL. The polarizing layer PF may include a first base member, a linear polarizing plate, a retardation layer such as a quarter-waver ($\lambda/4$) plate and/or a half-wave ($\lambda/2$) plate, and a second base member. For example, the first base member, the linear polarizing plate, the $\lambda/4$ plate, the $\lambda/2$ plate, and the second base member may be sequentially stacked on the sensor electrode layer SENL.

A cover window CW may be disposed on the polarizing layer PF. The cover window CW may be attached onto the polarizing layer PF by a transparent adhesive member such as an optical clear adhesive (OCA) or an optical clear resin (OCR). The cover window CW may be made of an inorganic material such as glass or be made of an organic material such as plastic or a polymer material.

Figure 10:
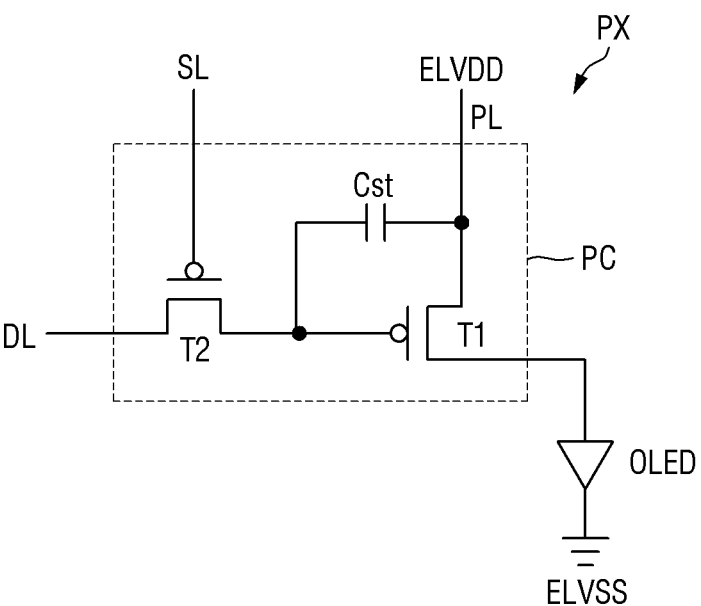
FIG. 10 is a schematic diagram one of an equivalent circuit of a pixel disposed on a display panel according to an embodiment.

FIG. 10 is a schematic diagram of an equivalent circuit of a pixel disposed on a display panel according to an embodiment.

Referring to FIG. 10, a pixel PX may include a pixel circuit PC and a light emitting element OLED as a display element electrically connected to the pixel circuit PC. The pixel circuit PC may include a first transistor T1, a second transistor T2, and a capacitor Cst. Each pixel PX may emit, for example, red, green, blue, or white light through the light emitting element OLED. The first transistor T1 and the second transistor T2 may be implemented as thin film transistors.

The second transistor T2, which is a switching transistor, may be electrically connected to a scan line SL and a data line DL, and may transmit a data signal input from the data line DL to the first transistor T1 in response to a switching voltage input from the scan line SL.

The capacitor Cst may be electrically connected to the second transistor T2 and a power voltage line PL, and may store a voltage corresponding to a difference between a voltage of the data signal transmitted from the second transistor T2 and a first power voltage ELVDD supplied from the power voltage line PL.

The first transistor T1, which is a driving transistor, may be electrically connected to the power voltage line PL and the capacitor Cst, and may control a driving current flowing to the light emitting element from the power voltage line PL in response to a voltage value stored in the capacitor Cst.

The light emitting element may emit light having a predetermined and selectable luminance by the driving current. A common electrode (e.g., a cathode) of the light emitting element may be supplied with a second power voltage ELVSS.

FIG. 10 illustrates that the pixel circuit PC includes two transistors T1 and T2 and one capacitor Cst, but the disclosure is not limited thereto. The number of transistors T and the number of capacitors Cst may be variously changed according to a design of the pixel circuit PC.

Figure 11:
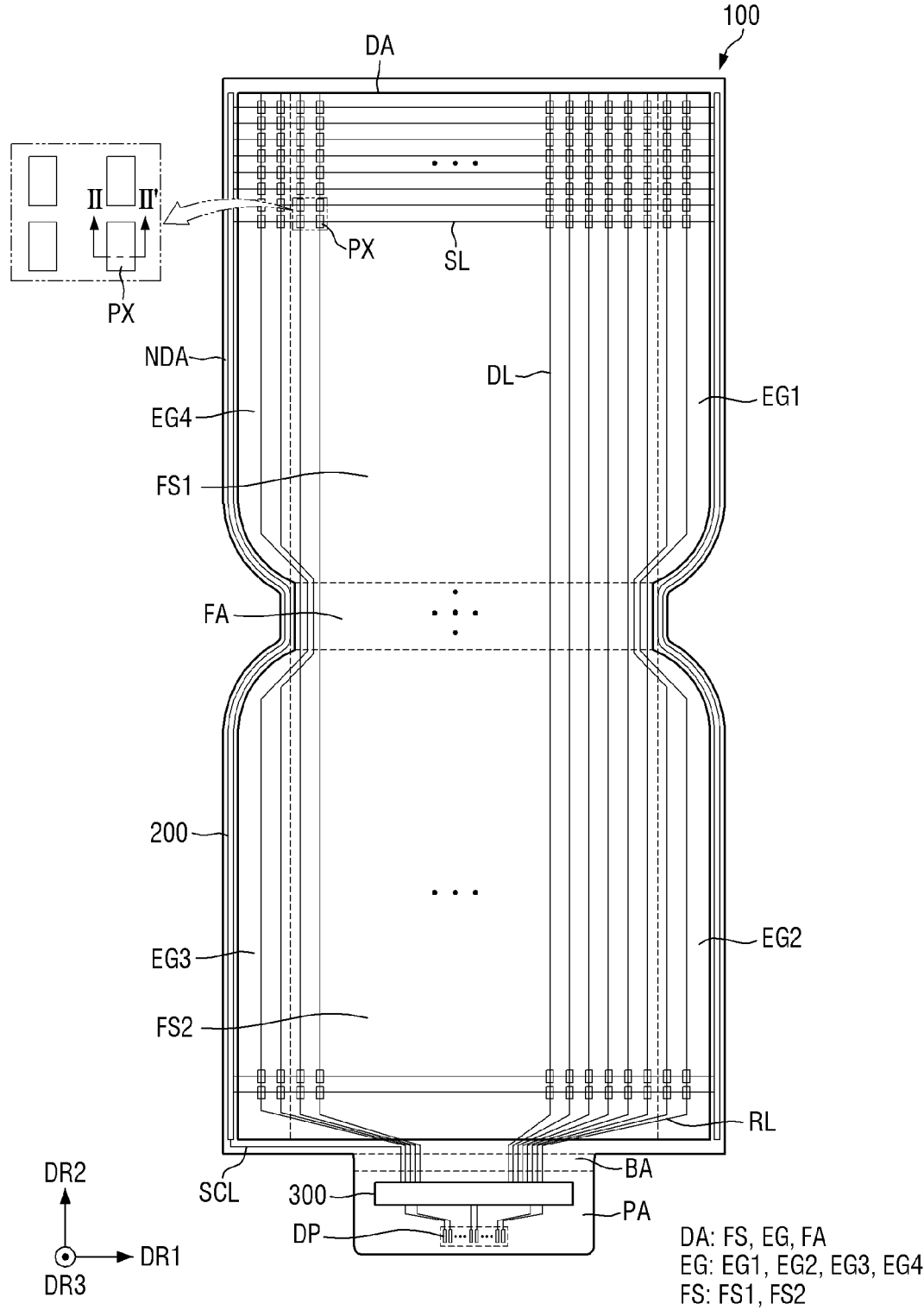
FIG. 11 is a plan view schematically illustrating a display panel according to an embodiment.

FIG. 11 is a plan view schematically illustrating a display panel according to an embodiment.

Referring to FIG. 11, the non-display area NDA of the display panel 100 may include a bending portion BA and a pad portion PA.

The bending portion BA may extend from a lower side of the display panel 100 in a plan view. The bending portion BA may be disposed on the pad portion PA, and a length of the bending portion BA in the first direction DR1 may be shorter than a length of the display panel 100 in the first direction DR1. The bending portion BA may be bent along a bending line on an upper side of the bending portion BA.

The pad portion PA may extend downward from the bending portion BA in a plan view. A length of the pad portion PA in the first direction DR1 may be substantially the same as the length of the bending portion BA in the first direction DR1. The pad portion PA may be bent along a bending line on a lower side of the bending portion BA.

A display driving circuit 300 and display pads DP may be disposed on the pad portion PA. The display driving circuit 300 may be formed as an integrated circuit (IC). The display driving circuit 300 may be attached onto the pad portion PA by an anisotropic conductive film or may be directly attached onto the pad portion PA by an ultrasonic bonding method. However, the disclosure is not limited thereto, and the display driving circuit 300 may be disposed on a circuit board disposed on the display pads DP of the pad portion PA.

In FIG. 11, for convenience of explanation, only pixels PX, scan lines SL, data lines DL, scan control line SCL, routing lines RL, scan driver 200, the display driving circuit 300, and the display pad DP are illustrated.

Referring to FIG. 11, the scan lines SL, the data lines DL, and the pixels PX may be disposed in the display area DA. The scan lines SL may be disposed in the first direction DR1, and the data lines DL may be disposed in the second direction DR2 intersecting the first direction DR1.

The pixels PX may be disposed at intersections of the scan lines SL and the data lines DL. Each of the pixels PX may be electrically connected to at least one of the scan lines SL and to at least one of the data lines DL.

Each of the pixels PX may include the thin film transistors including the driving transistor T1 (see FIG. 10), at least one switching transistor T2 (see FIG. 10), the light emitting element, and the capacitor Cst (see FIG. 10). In case that a scan signal is applied from the scan line SL by at least one switching transistor T2 to each of the pixels PX, each of the pixels PX may emit light by supplying a data voltage of the data line DL and supplying a driving current to the light emitting element in response to a data voltage applied to a gate electrode of the driving transistor T1.

The scan driver 200 may be electrically connected to the display driving circuit 300 through at least one scan control line SCL. The scan driver 200 may generate scan signals according to a scan control signal of the display driving circuit 300 and may supply the scan signals to the scan lines SL.

The scan driver 200 may be disposed in the non-display area NDA along a periphery of the display panel 100. FIG. 11 illustrates that the scan driver 200 is formed in both sides of the non-display area NDA, but the disclosure is not limited thereto. For example, the scan driver 200 may be formed only in the non-display area NDA on the left side of the display area DA.

For example, the scan driver 200 may include a linear shape and a curved shape, may be integrally formed, and may be disposed in the non-display area NDA of the edge portion EG and the non-display area NDA of the folding portion FA in the second direction DR2.

As illustrated in FIG. 11, in case that the scan driver 200 is formed in the non-display area NDA of the display panel 100, the scan driver 200 may include thin film transistors.

The display driving circuit 300 may be electrically connected to the display pads DP to receive digital video data and timing signals. The display driving circuit 300 may convert the digital video data into analog positive/negative data voltages and may supply the analog positive/negative data voltages to the data lines DL through routing lines RL.

The display driving circuit 300 may generate and supply a scan control signal for controlling the scan driver 200 through the scan control line SCL. The pixels PX to which the data voltages are to be supplied may be selected by the scan signals of the scan driver 200, and the data voltages may be supplied to the selected pixels PX.

Figure 12:
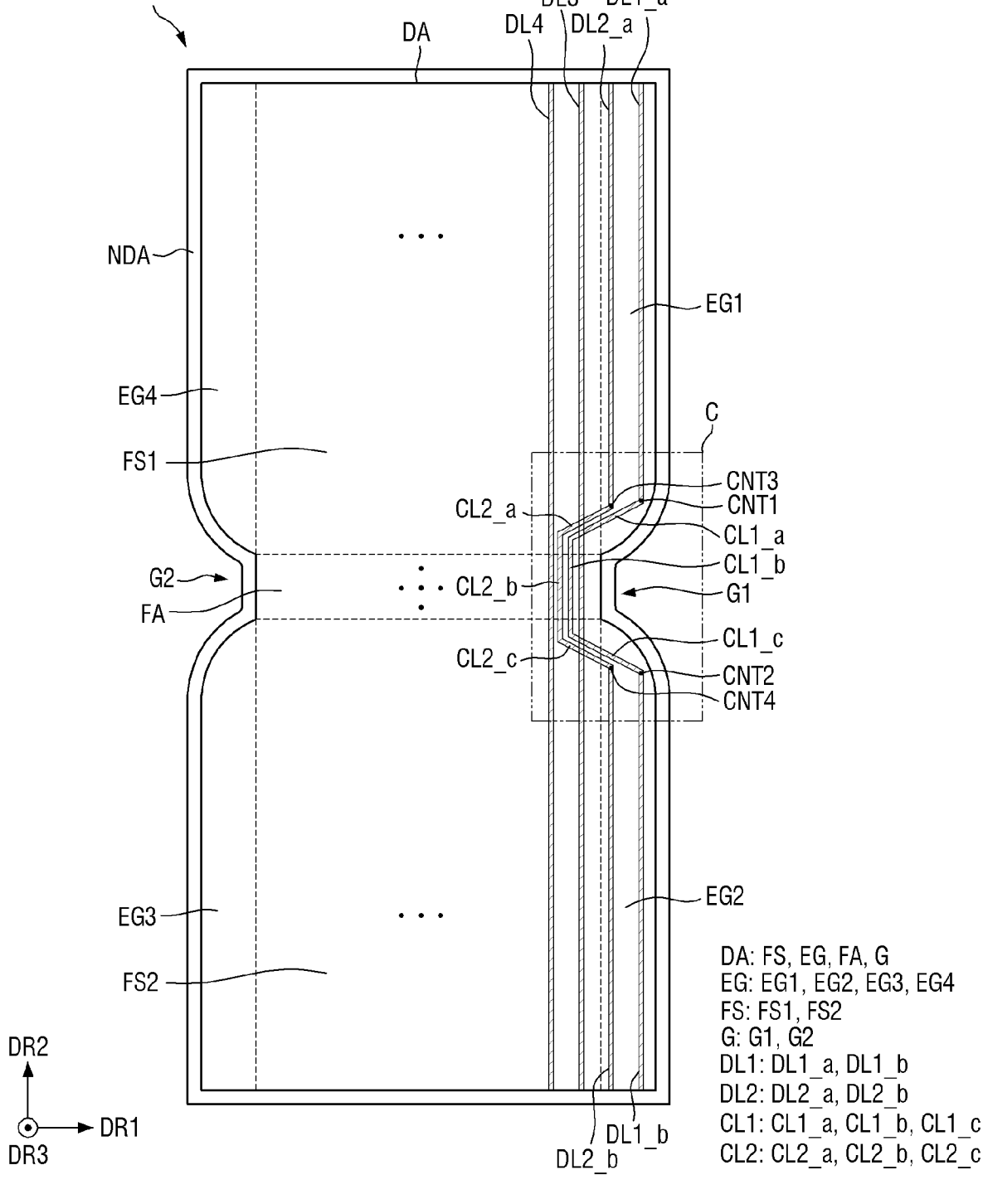
FIG. 12 is a plan view schematically illustrating data lines of the display panel according to an embodiment.
Figure 13:
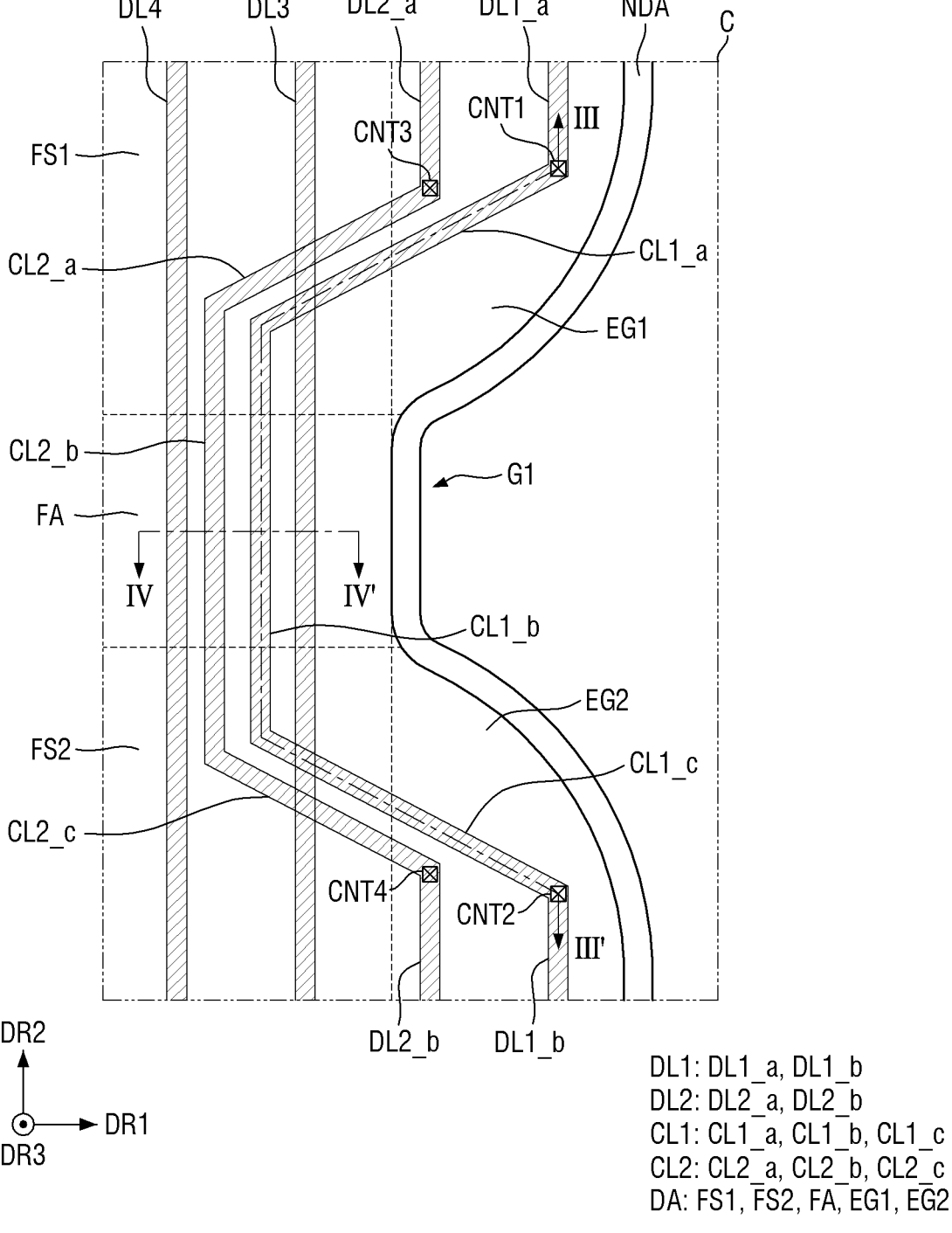
FIG. 13 is an enlarged view of area C illustrated in FIG. 11.

FIG. 12 is a plan view schematically illustrating data lines of the display panel according to an embodiment. FIG. 13 is an enlarged view of area C illustrated in FIG. 12.

In FIG. 12, for convenience of explanation, only the data lines DL included in the display area DA of the display panel 100 are illustrated.

In FIG. 12, only data lines and connection lines adjacent to the first concave portion G1 are illustrated, and the display panel 100 includes four data lines and two connection lines, but this is only for convenience of explanation, and the display area DA of the display panel 100 may include more data lines and connection lines than the four data lines and the two connection lines.

Referring to FIG. 12, the display panel 100 may include a first data line DL1, a second data line DL2, a third data line DL3, and a fourth data line DL4 disposed on the display area DA, extending in the second direction DR2, generally parallel to each other.

The first data line DL1, the second data line DL2, the third data line DL3, and the fourth data line DL4 may be disposed to be spaced apart from each other with same intervals in the first direction DR1. However, the disclosure is not limited thereto, and in some embodiments, the intervals between the first data line DL1, the second data line DL2, the third data line DL3, and the fourth data line DL4 may be different from each other.

The first data line DL1 may include a first portion DL1_a and a second portion DL1_b spaced apart from each other by the first concave portion G1. The second portion DL1_b of the first data line DL1 may be disposed to coincide with an imaginary line extending from the first portion DL1_a in the second direction DR2. For example, an imaginary line extending from the first portion DL1_a in the second direction DR2 and an imaginary line extending from the second portion DL1_b in the second direction DR2 may coincide with each other. For example, the first portion DL1_a may be collinear with the second portion DL1_b. The first data line DL1 may be integrally formed and may be disconnected by the first concave portion G1 to include the first portion DL1_a and the second portion DL1_b.

For example, the first portion DL1_a of the first data line DL1 may be disposed on the first edge portion EG1, and the second portion DL1_b thereof may be disposed on the second edge portion EG2.

Like the first data line DL1, the second data line DL2 may also include a first portion DL2_a and a second portion DL2_b spaced apart from each other by the first concave portion G1, and the first portion DL2_a may be disposed on the first edge portion EG1, and the second portion DL2_b may be disposed on the second edge portion EG2.

The third data line DL3 and the fourth data line DL4 may be continuously disposed on the first flat portion FS1, the folding portion FA, and the second flat portion FS2 in the second direction DR2.

For example, since the third data line DL3 is not disposed on the display area DA of the first edge portion EG1 and the second edge portion EG2, the third data line DL3 may not have a portion that at least partially overlaps the first concave portion G1 unlike the first data line DL1 and the second data line DL2. Accordingly, the third data line DL3 may be integrally formed without being disconnected or spaced apart by the first concave portion G1.

Since the fourth data line DL4 is also not disposed on the display area DA of the first edge portion EG1 and the second edge portion EG2 like the third data line DL3, the fourth data line DL4 may not have a portion that at least partially overlaps the first concave portion G1. Accordingly, the fourth data line DL4 may also be integrally formed without being disconnected or spaced apart by the first concave portion G1 like the third data line DL3.

Referring to FIGS. 12 and 13, the connection line CL may include a first connection line CL1 and a second connection line CL2. The first connection line CL1 and the second connection line CL2 may be disposed in the display area DA of the first edge portion EG1, the second edge portion EG2, the first flat portion FS1, the second flat portion FS2, and the folding portion FA adjacent to the edge area of the first concave portion G1, and may bypass the first concave portion G1.

The first data line DL1 and the second data line DL2 disposed on the display area DA of the first edge portion EG1 and the second edge portion EG2 may extend in the second direction DR2 and may be disconnected by the first concave portion G1, and the first data line DL1 and the second data line DL2 that are disconnected from each other may be electrically connected to each other by the first connection line CL1 and the second connection line CL2 disposed along an edge of the first concave portion G1.

The first connection line CL1 and the second connection line CL2 may bypass along the edge of the first concave portion G1, may be disposed on the display area DA around the first concave portion G1, and may be disposed on a different layer from adjacent data lines DL. For example, the first connection line CL1 and the second connection line CL2 may be disposed to pass through the first edge portion EG1, the first flat portion FS1, the folding portion FA, the second flat portion FS2, and the second edge portion EG2 around the first concave portion G1.

A detailed description of the connection lines CL and the data lines DL disposed on different layers will be described with reference to FIGS. 15 to 21.

The first connection line CL1 may include a first portion CL1_a, a second portion CL1_b extending from an end portion of the first portion CL1_a, and a third portion CL1_c extending from an end portion of the second portion CL1_b.

The first portion CL1_a may extend in a diagonal direction from the first edge portion EG1 toward the folding portion FA and pass through the first edge portion EG1 and the first flat portion FS1, and the second portion CL1_b may extend from the end portion of the first portion CL1_a, pass through the first flat portion FS1, the folding portion FA, and the second flat portion FS2 around the concave portion G, and extend in the second direction DR2.

The third portion CL1_c may extend from the end portion of the second portion CL1_b, extend in the diagonal direction from the second flat portion FS2 toward the second edge portion EG2, and pass through the second flat portion FS2 and the second edge portion EG2.

The first connection line CL1 may include a first contact hole CNT1 electrically contacting the first portion DL1_a of the first data line DL1, and a second contact hole CNT2 electrically contacting the second portion DL1_b of the first data line DL1.

The same signal may be applied to the first portion DL1_a and the second portion DL1_b of the first data line DL1 through the first contact hole CNT1 and the second contact hole CNT2. For example, one signal may be applied to the first data line DL1 including the first portion DL1_a and the second portion DL1_b.

In an embodiment, since the first connection line CL1 and the third data line DL3 are disposed on different layers, the first portion CL1_a and the third portion CL1_c of the first connection line CL1 may overlap a portion of the third data line DL3 in the third direction DR3, and the second portion CL1_b thereof may be disposed in an area between the third data line DL3 and the fourth data line DL4 in a plan view and extend in the second direction DR2 without overlapping other adjacent data lines DL. However, the disclosure is not limited thereto, and in another embodiment, the second portion CL1_b of the first connection line CL1 may also overlap a portion of the third data line DL3 in the third direction DR3.

Although the first connection line CL1 has been described as a reference, the same may also be applied to the second connection line CL2.

As illustrated in FIGS. 12 and 13, a distance from the first concave portion G1 may increase from the first connection line CL1 to the second connection line CL2. For example, the first connection line CL1 may be disposed to be closer to the first concave portion G1, the second connection line CL2 may be disposed to be further from the first concave portion G1, and the first connection line CL1 and the second connection line CL2 may be disposed to be closer than the first data line DL1, the second data line DL2, the third data line DL3, and the fourth data line DL4 disposed adjacent to each other.

The arrangement of the first connection line CL1 and the second connection line CL2 may vary, and is not limited to the embodiment illustrated in FIGS. 12 and 13.

In case that the first connection line CL1 and the second connection line CL2 are disposed on the same layer as the first data line DL1, the second data line DL2, the third data line DL3, and the fourth data line DL4 adjacent to each other in the display area DA adjacent to the edge area of the first concave portion G1, a space in which the first connection line CL1 and the second connection line CL2 may be disposed may be narrow due to the first data line DL1, the second data line DL2, the third data line DL3, and the fourth data line DL4 previously disposed on the display area DA adjacent to the first concave portion G1, such that the first connection line CL1 and the second connection line CL2 may electrically contact the first data line DL1, the second data line DL2, the third data line DL3, and the fourth data line DL4.

Therefore, as the first connection line CL1 and the second connection line CL2 bypassing the first concave portion G1 are disposed on the different layer from the first data line DL1, the second data line DL2, the third data line DL3, and the fourth data line DL4, it may possible to prevent the first connection line CL1 and the second connection line CL2 from contacting the first data line DL1, the second data line DL2, the third data line DL3, and the fourth data line DL4. As a result, the first data line DL1 and the second data line DL2 disconnected by the first connection line CL1 and the second connection line CL2 may be electrically connected to each other, and the image may be provided to the user even in the display area DA of the edge portions EG.

Hereinafter, a cross-sectional view of the display panel 100 according to an embodiment will be described.

Figure 14:
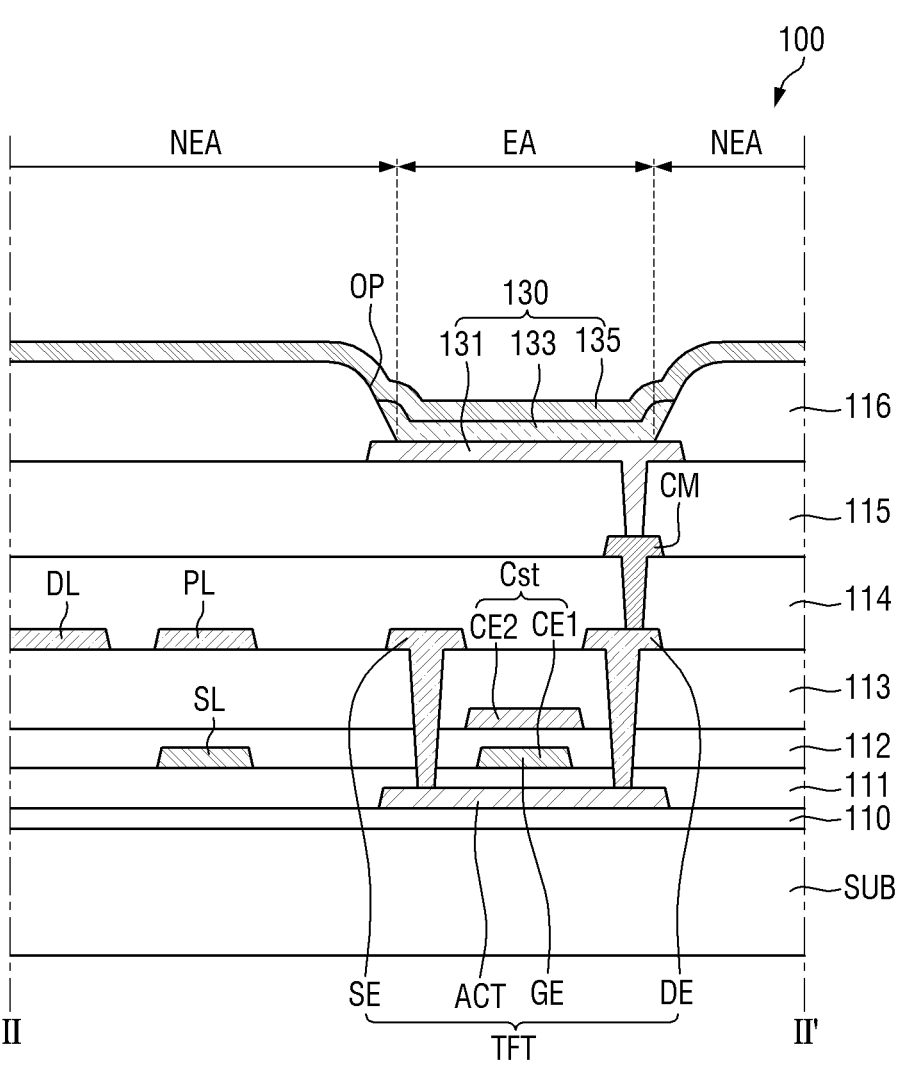
FIG. 14 is a schematic cross-sectional view illustrating an embodiment of the display panel taken along line II-II' of FIG. 11 according to an embodiment.

FIG. 14 is a schematic cross-sectional view illustrating an embodiment of the display panel taken along line II-II' of FIG. 11 according to an embodiment. For convenience of explanation, some circuit elements and lines are omitted.

In FIG. 14, a light emitting element layer 130 may be the light emitting element OLED of FIG. 10. A thin film transistor TFT may be one of the transistors T1 and T2 of FIG. 10.

As described above, the substrate SUB may have flexible characteristics to maintain display performance even when the display device is bent. To this end, the substrate SUB may be formed to have a thin thickness and may include a material having elasticity.

A buffer layer 110 may be positioned on the substrate SUB. The buffer layer 110 may serve to planarize a surface of the substrate SUB or prevent impurities and the like from permeating into a semiconductor layer thereon. The buffer layer 110 may have a single layer or multilayer structure formed of an inorganic insulating material such as silicon oxide, silicon nitride, or silicon oxynitride. The buffer layer 110 may be omitted.

A thin film transistor TFT may be disposed on the buffer layer 110. The thin film transistor TFT may include a semiconductor layer ACT, a gate electrode GE, a source electrode SE, and a drain electrode DE.

The semiconductor layer ACT may include amorphous silicon, polysilicon, or an organic semiconductor material. The semiconductor layer ACT may include a source area, a drain area, and a channel area between the source area and the drain area.

The gate electrode GE may have a single layer or multilayer structure formed of one or more materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like.

A first insulating layer 111 may be disposed between the semiconductor layer ACT and the gate electrode GE. A second insulating layer 112 and a third insulating layer 113 may be disposed between the gate electrode GE, the source electrode SE, and the drain electrode DE. The first insulating layer 111, the second insulating layer 112, and the third insulating layer 113 may include an inorganic material such as silicon oxide, silicon nitride, and/or silicon oxynitride. The scan line SL of FIG. 11 and the gate electrode GE may be disposed on the same layer, for example, on the first insulating layer 111.

The source electrode SE and the drain electrode DE may be electrically connected to the source area and the drain area of the semiconductor layer ACT through contact holes formed in the first insulating layer 111, the second insulating layer 112, and the third insulating layer 113, respectively.

The source electrode SE and the drain electrode DE may have a single layer or multilayer structure formed of one or more materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like.

The capacitor Cst may include a lower electrode CE1 and an upper electrode CE2 that overlap each other with the second insulating layer 112 interposed therebetween. The capacitor Cst may overlap the thin film transistor TFT.

FIG. 14 illustrates that the gate electrode GE of the thin film transistor TFT and the lower electrode CE1 of the capacitor Cst are integral with each other. However, the disclosure is not limited thereto, and in some embodiments, the capacitor Cst may not overlap the thin film transistor TFT, and the lower electrode CE1 of the capacitor Cst may be a separate and independent component from the gate electrode GE of the thin film transistor TFT. The capacitor Cst may be covered with the third insulating layer 113.

The pixel circuit PC including the thin film transistor TFT and the capacitor Cst may be covered by a fourth insulating layer 114 and a fifth insulating layer 115. The fourth insulating layer 114 and the fifth insulating layer 115 may be an organic insulating layer as a planarization insulating layer. The fourth insulating layer 114 and the fifth insulating layer 115 may include organic insulating materials such as general-purpose polymer such as polymethylmethacrylate (PMMA) or polystyrene (PS), polymer derivatives having phenolic groups, acrylic polymers, imide-based polymers, arylether-based polymers, amide-based polymers, fluorine-based polymers, p-xylene-based polymers, vinyl alcohol-based polymers, and blends thereof. In an embodiment, the fourth insulating layer 114 and the fifth insulating layer 115 may include polyimide.

Various conductive layers may be further disposed on the third insulating layer 113. For example, the data line DL and the power voltage line PL may be disposed on the third insulating layer 113, for example, on the same layer as the source electrode SE and the drain electrode DE. The data line DL and the power voltage line PL may include molybdenum (Mo), aluminum (Al), copper (Cu), titanium (Ti), and the like, and may have a multilayer or single layer structure. In an embodiment, the data line DL and the power voltage line PL may have a multilayer structure of Ti/Al/Ti.

The fourth insulating layer 114 may be disposed on the data line DL and the power voltage line PL. A connection electrode CM may be disposed on the fourth insulating layer 114. The connection electrode CM may electrically connect a first electrode 131 and the source electrode SE or the drain electrode DE of the thin film transistor TFT. The connection electrode CM may include at least one of molybdenum (Mo), aluminum (Al), copper (Cu), titanium (Ti), and alloys thereof, and may have a multilayer or single layer structure. In an embodiment, the connection electrode CM may have a multilayer structure of Ti/Al/Ti.

The light emitting element layer 130 may be disposed on the fifth insulating layer 115. The light emitting element layer 130 may include a first electrode 131, a second electrode 135, and a light emitting layer 133 between the first electrode 131 and the second electrode 135.

The first electrode 131 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

In some embodiments, the first electrode 131 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first electrode 131 may further include a layer formed of ITO, IZO, ZnO, or $In_2O_3$ on the upper/lower side of the aforementioned reflective layer.

A sixth insulating layer 116 covering an edge of the first electrode 131 may be disposed on the fifth insulating layer 115. The sixth insulating layer 116 may have an opening OP exposing a portion of the first electrode 131. The opening of the sixth insulating layer 116 may define a light emitting area EA. For example, the display area DA may include the light emitting areas EA and the light non-emitting area NEA surrounding the light emitting areas EA between the light emitting areas EA.

The sixth insulating layer 116 may be disposed to correspond to the light non-emitting area NEA, and may include an organic material such as acryl, benzocyclobutene (BCB), polyimide, or hexamethyldisiloxane (HMDSO). In another embodiment, the sixth insulating layer 116 may include the aforementioned inorganic material that may form the first insulating layer 111, the second insulating layer 112, and the third insulating layer 113.

A light emitting layer 133 may be formed on the first electrode 131 exposed by the opening OP of the sixth insulating layer 116. The light emitting layer 133 may include a polymer or low molecular organic material that emits light of a predetermined (or selectable) color. The light emitting layer may be a red light emitting layer, a green light emitting layer, or a blue light emitting layer. In another embodiment, the light emitting layer may have a multilayer structure in which the red light emitting layer, the green light emitting layer, and the blue light emitting layer are stacked each other to emit white light, or may have a single layer structure including a red light emitting material, a green light emitting material, and a blue light emitting material.

In an embodiment, the light emitting layer 133 may include a first functional layer disposed on a lower side of the light emitting layer and a second functional layer disposed on an upper side of the light emitting layer. The first functional layer and the second functional layer may include a layer integrally formed across multiple first electrodes 131, and may also include a layer patterned to correspond to each of the first electrodes 131.

The second electrode 135 may be disposed to face the first electrode 131 with the light emitting layer 133 interposed therebetween. The second electrode 135 may be formed of a conductive material having a low work function. For example, the second electrode 135 may include a transparent (or semi-transparent) layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In another embodiment, the second electrode 135 may further include a layer such as ITO, IZO, ZnO, or $In_2O_3$ on the transparent layer including the aforementioned material.

FIG. 14 illustrates an embodiment in which the data line DL and the power voltage line PL are provided on the third insulating layer 113, but in some embodiments, the data line DL, the power voltage line PL, and the connection electrode CM may be disposed on the same layer, for example, on the fourth insulating layer 114.

FIGS. 15 to 21 are schematic cross-sectional views illustrating various embodiments of the display panel taken along line III-III' of FIG. 13.

FIGS. 15 to 21 schematically illustrate the data lines DL and the connection lines CL disposed in the display area DA adjacent to the first concave portion G1 for convenience of explanation.

Figure 15:
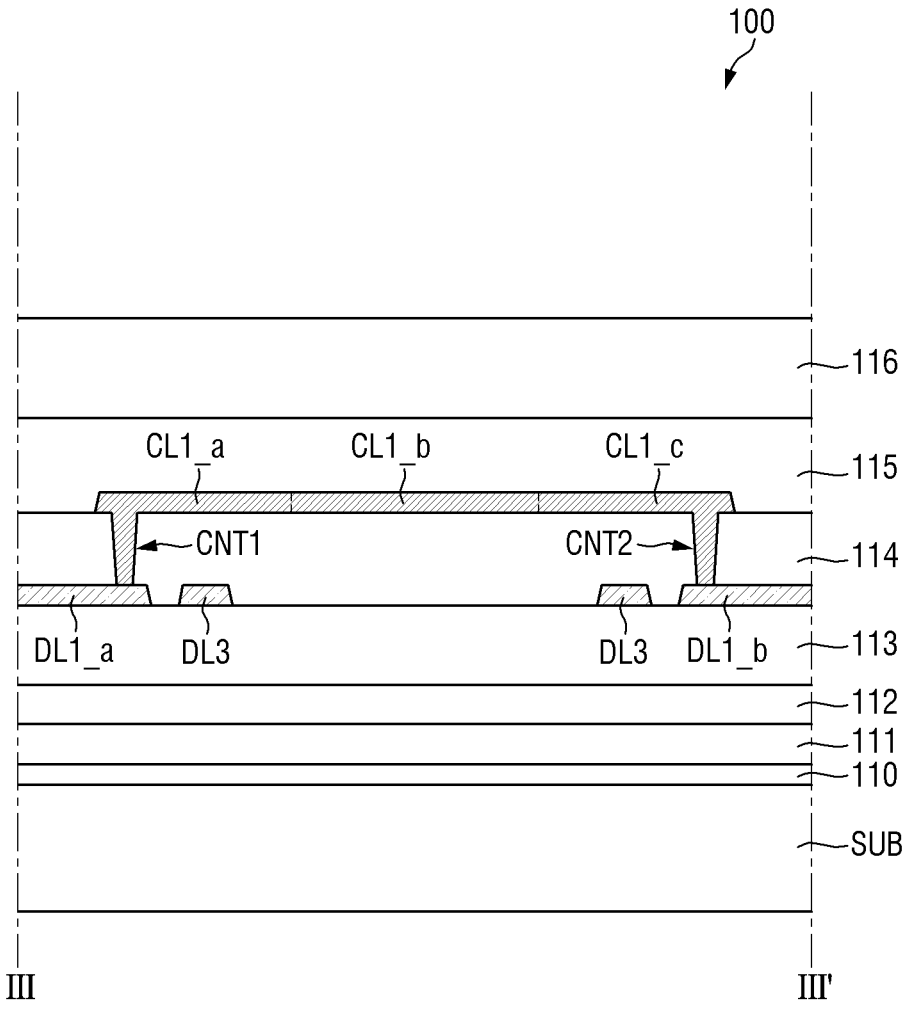
FIG. 15 is a schematic cross-sectional view illustrating an embodiment of the display panel taken along line III-III' of FIG. 13 according to an embodiment.

FIG. 15 is a schematic cross-sectional view illustrating an embodiment of the display panel taken along line III-III' of FIG. 13 according to an embodiment.

As illustrated in FIG. 15, on the schematic cross-sectional view of the display panel 100 according to an embodiment, the first connection line CL1 may be a line disposed on a different layer from the first portion DL1_a and the second portion DL1_b of the first data line DL1 and the third data line DL3, and electrically connected to the first portion DL1_a and the second portion DL1_b of the first data line DL1.

For example, the first portion DL1_a and the second portion DL1_b of the first data line DL1 and the third data line DL3 may be disposed on the third insulating layer 113, and the first connection line CL1 may be disposed on the fourth insulating layer 114. The first portion CL1_a of the first connection line CL1 may be electrically connected to the first portion DL1_a of the first data line DL1 through a first contact hole CNT1 formed in the fourth insulating layer 114.

The third portion CL1_c of the first connection line CL1 may be electrically connected to the second portion DL1_b of the first data line DL1 through a second contact hole CNT2 formed in the fourth insulating layer 114.

Since the first portion CL1_a and the third portion CL1_c of the first connection line CL1 are disposed on the fourth insulating layer 114, and the third data line DL3 is disposed on the third insulating layer 113, the first portion CL1_a and the third portion CL1_c of the first connection line CL1 may be positioned on an upper side of the third data line DL3, and a portion of the first portion CL1_a and the third portion CL1_c and the third data line DL3 may overlap each other in the thickness direction.

The first connection line CL1 may include a first portion CL1_a, a second portion CL1_b, and a third portion CL1_c and may be integral with each other. The first connection line CL1 and the connection electrode CM (see FIG. 14) may be directly disposed on the fourth insulating layer 114. The first connection line CL1 and the connection electrode CM (see FIG. 14) may include the same material, and may be formed simultaneously. However, the disclosure is not limited thereto, and the connection line CL1 may include a material different from that of the connection electrode CM.

As described above, since the first connection line CL1 and the first data line DL1 and the third data line DL3 adjacent to each other are disposed on different layers, it may be possible to bypass the first concave portion G1 while preventing the first connection line CL1 from contacting the first data line DL1 and the third data line DL3.

The first connection line CL1 may also be disposed on a different layer from the power voltage line PL disposed on the third insulating layer 113 and the scan line SL disposed on the first insulating layer 111 to prevent from contacting other lines.

Figure 16:
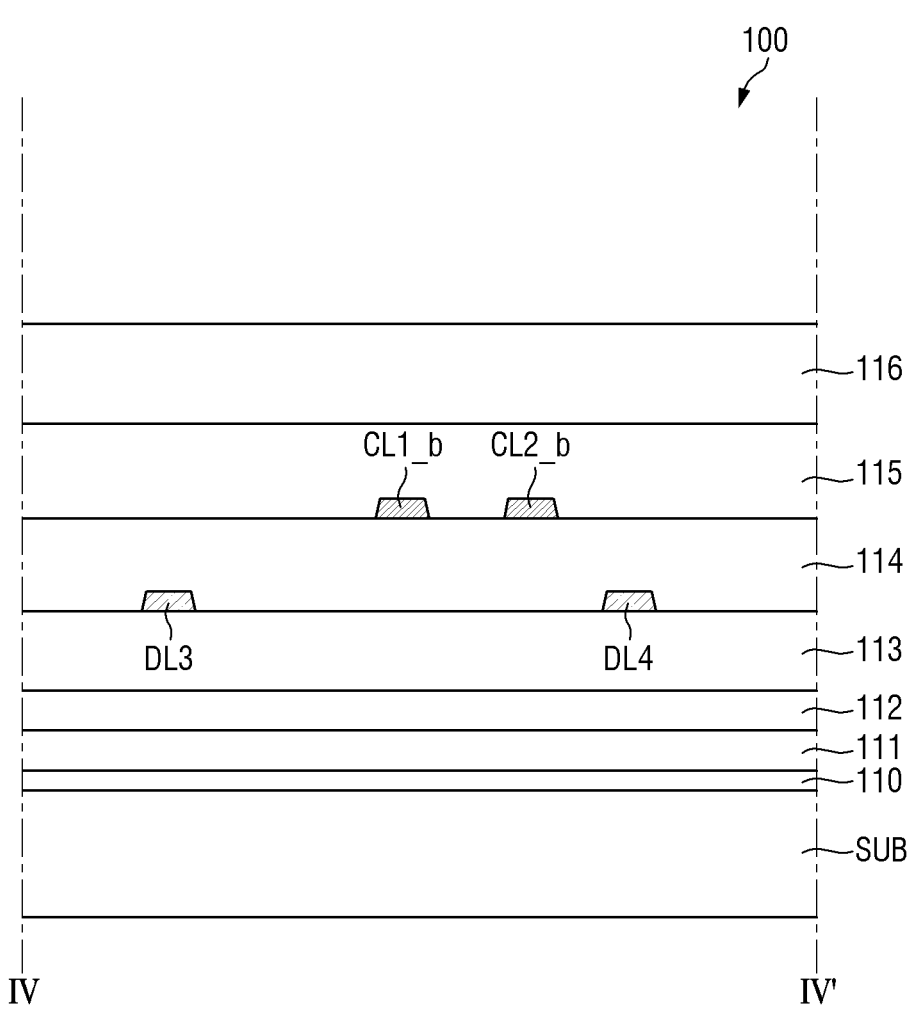
FIG. 16 is a schematic cross-sectional view illustrating an embodiment of the display panel taken along line IV-IV' of FIG. 13 according to an embodiment.

FIG. 16 is a schematic cross-sectional view illustrating an embodiment of the display panel taken along line IV-IV' of FIG. 13 according to an embodiment.

Referring to FIG. 16, on the schematic cross-sectional view of the display panel 100 according to an embodiment, the third data line DL3 and the fourth data line DL4 may be disposed to be spaced apart from each other in a horizontal direction on the third insulating layer 113, and the second portion CL1_b of the first connection line CL1 and the second portion CL2_b of the second connection line CL2 may be disposed to be spaced apart from each other in the horizontal direction on the fourth insulating layer 114.

The second portion CL1_b of the first connection line CL1 and the second portion CL2_b of the second connection line CL2 disposed on the fourth insulating layer 114 may not overlap the third data line DL3 and the fourth data line DL4 disposed on the third insulating layer 113 in the thickness direction, and may be disposed between the third data line DL3 and the fourth data line DL4.

Referring to FIGS. 13 and 16, since the first connection line CL1 and the second connection line CL2 are closely disposed on the display area DA adjacent to the first concave portion G1 compared to the third data line DL3 and the fourth data line DL4 that do not bypass the first concave portion G1, a distance between the second portion CL1_b of the first connection line CL1 and the second portion CL2_b of the second connection line CL2 may be shorter than a distance between the third data line DL3 and the fourth data line DL4.

Hereinafter, other embodiments will be described with reference to FIGS. 17 to 21. In the following embodiments, a description for the same configurations as those of the embodiment described above will be omitted or simplified and configurations different from those of the embodiment described above will be described.

Figure 17:
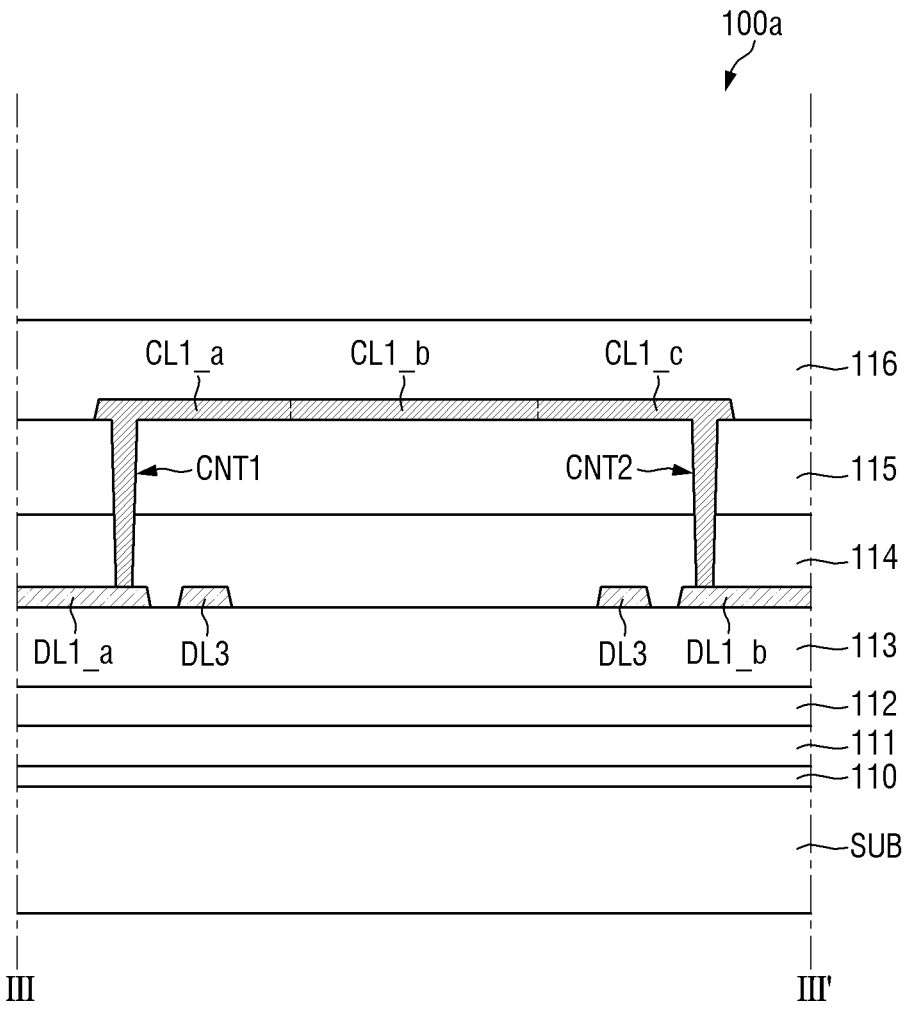
FIG. 17 is a schematic cross-sectional view illustrating an embodiment of a display panel taken along line III-III' of FIG. 13 according to another embodiment.

FIG. 17 is a schematic cross-sectional view illustrating an embodiment of a display panel taken along line III-III' of FIG. 13 according to another embodiment.

Referring to FIG. 17, the embodiment is different from the embodiment of FIG. 15 in that on the schematic cross-sectional view of a display panel 100a according to another embodiment, the first connection line CL1 may be disposed on the fifth insulating layer 115, the first portion CL1_a of the first connection line CL1 may be electrically connected to the first portion DL1_a of the first data line DL1 through the first contact hole CNT1 formed in the fourth insulating layer 114 and the fifth insulating layer 115, and the third portion CL1_c of the first connection line CL1 may be electrically connected to the second portion DL1_b of the first data line DL1 through the second contact hole CNT2 formed in the fourth insulating layer 114 and the fifth insulating layer 115.

Unlike the embodiment of FIG. 15, the first connection line CL1 may be formed simultaneously with the first electrode 131 (see FIG. 14) disposed on the fifth insulating layer 115, and may include the same material as the first electrode 131. However, the disclosure is not limited thereto.

Figure 18:
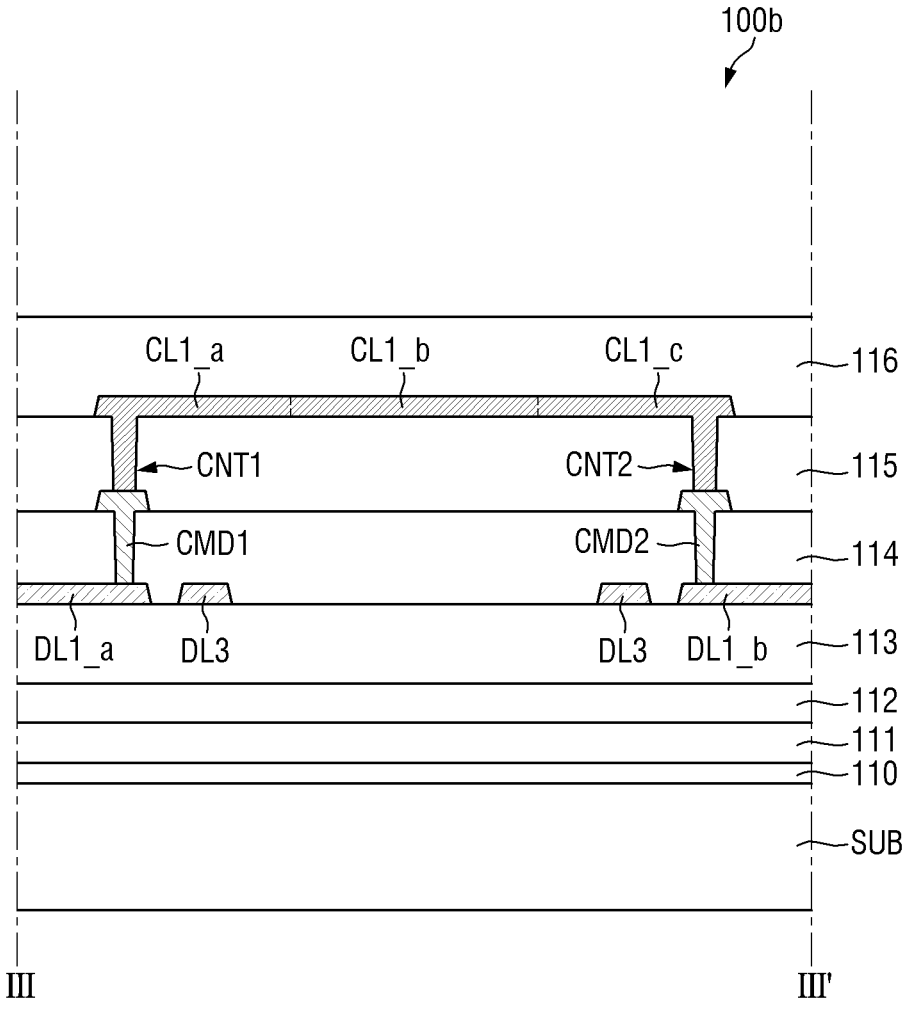
FIG. 18 is a schematic cross-sectional view illustrating an embodiment of a display panel taken along line III-III' of FIG. 13 according to still another embodiment.

FIG. 18 is a schematic cross-sectional view illustrating an embodiment of a display panel taken along line III-III' of FIG. 13 according to still another embodiment.

Referring to FIG. 18, the embodiment is different from the embodiments of FIGS. 15 and 17 in that on the schematic cross-sectional view of a display panel 100b according to still another embodiment, the first connection line CL1 may be disposed on the fifth insulating layer 115, the first portion CL1_a of the first connection line CL1 may be electrically connected to a first sub-connection electrode CMD1 through the first contact hole CNT1 formed in the fifth insulating layer 115 and may be electrically connected to the first portion DL1_a of the first data line DL1 through the first sub-connection electrode CMD1, and the third portion CL1_c thereof may be electrically connected to a second sub-connection electrode CMD2 through the second contact hole CNT2 formed in the fifth insulating layer 115 and may be electrically connected to the second portion DL1_b of the first data line DL1 through a second sub-connection electrode CMD2.

The first sub-connection electrode CMD1 and the second sub-connection electrode CMD2 may include the same material as the connection electrode CM disposed on the fourth insulating layer 114. However, the disclosure is not limited thereto.

Figure 19:
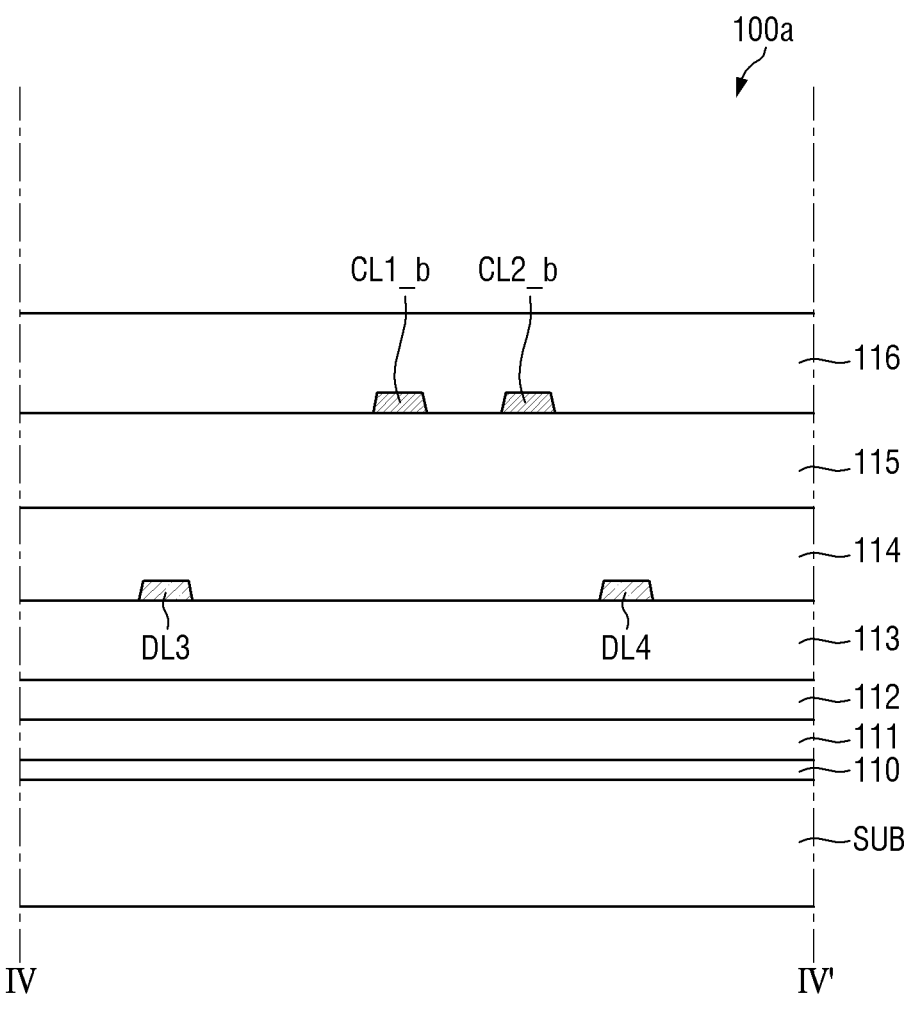
FIG. 19 is a schematic cross-sectional view illustrating an embodiment of the display panel taken along line IV-IV' of FIG. 13 according to another embodiment.

FIG. 19 is a schematic cross-sectional view illustrating an embodiment of the display panel taken along line IV-IV' of FIG. 13 according to another embodiment.

Referring to the schematic cross-sectional view of the display panel 100a according to another embodiment of FIG. 19, the embodiment is different from the embodiment of FIG. 16 in that because the third data line DL3 and the fourth data line DL4 are disposed to be spaced apart from each other in a horizontal direction on the third insulating layer 113, and the second portion CL1_b of the first connection line CL1 and the second portion CL2_b of the second connection line CL2 are disposed to be spaced apart from each other in the horizontal direction on the fifth insulating layer 115, the third data line DL3 and the fourth data line DL4 may be disposed to be spaced apart from the second portion CL1_b of the first connection line CL1 and the second portion CL2_b of the second connection line CL2 with the fourth insulating layer 114 and the fifth insulating layer interposed therebetween.

The schematic cross-sectional view of the display panel 100 taken along line IV-IV' of FIG. 13 may be the same as that of FIG. 19.

Figure 20:
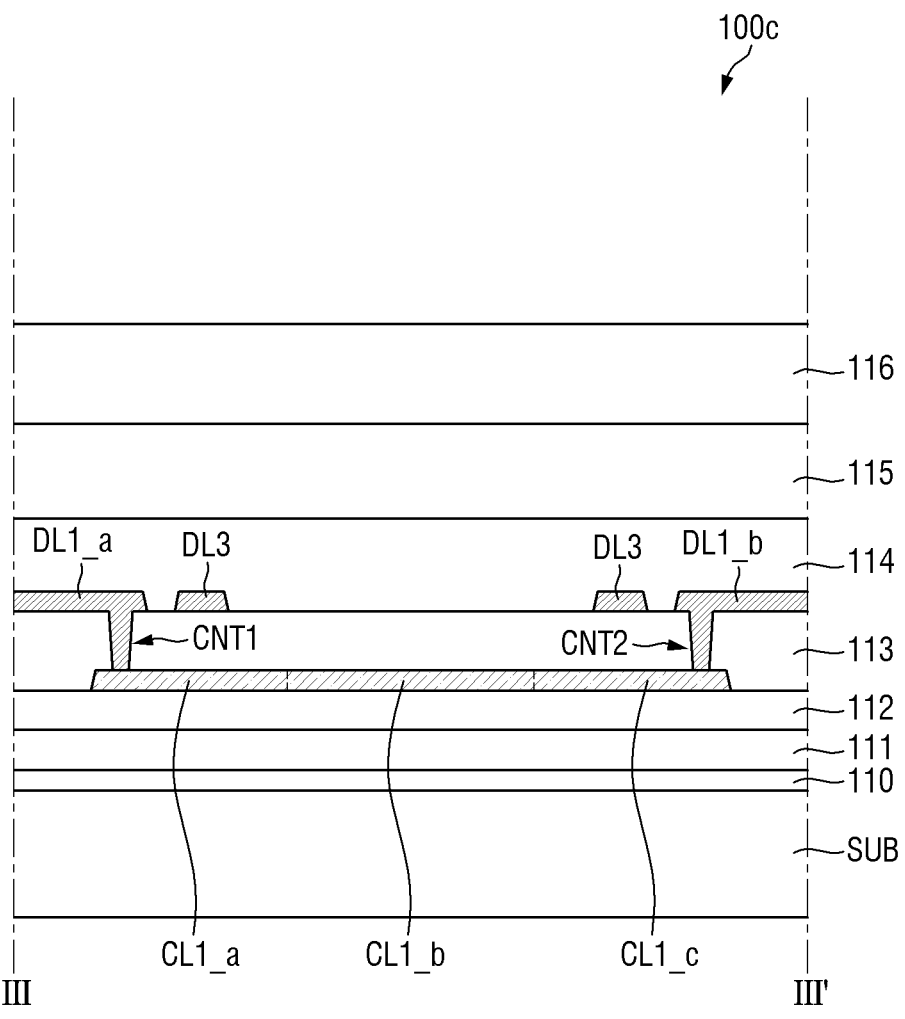
FIG. 20 is a schematic cross-sectional view illustrating an embodiment of a display panel taken along line III-III' of FIG. 13 according to still another embodiment.

FIG. 20 is a schematic cross-sectional view illustrating an embodiment of a display panel taken along line III-III' of FIG. 13 according to still another embodiment.

Referring to FIG. 20, the embodiment is different from the embodiments of FIGS. 16 and 19 in that on the schematic cross-sectional view of a display panel 100c according to still another embodiment, the first portion DL1_a and the second portion DL1_b of the first data line DL1 may be disposed on the third insulating layer 113, the first connection line CL1 may be disposed on the second insulating layer 112, and the third data line DL3 may be positioned on the first portion CL1_a and the third portion CL1_c of the first connection line CL1 and may overlap a portion of the first portion CL1_a and the third portion CL1_c of the first connection line CL1 in the thickness direction.

The first connection line CL1 may be formed simultaneously with the upper electrode CE2 (see FIG. 14) of the capacitor Cst disposed on the second insulating layer 112, and may include the same material as the upper electrode CE2. However, the disclosure is not limited thereto.

Figure 21:
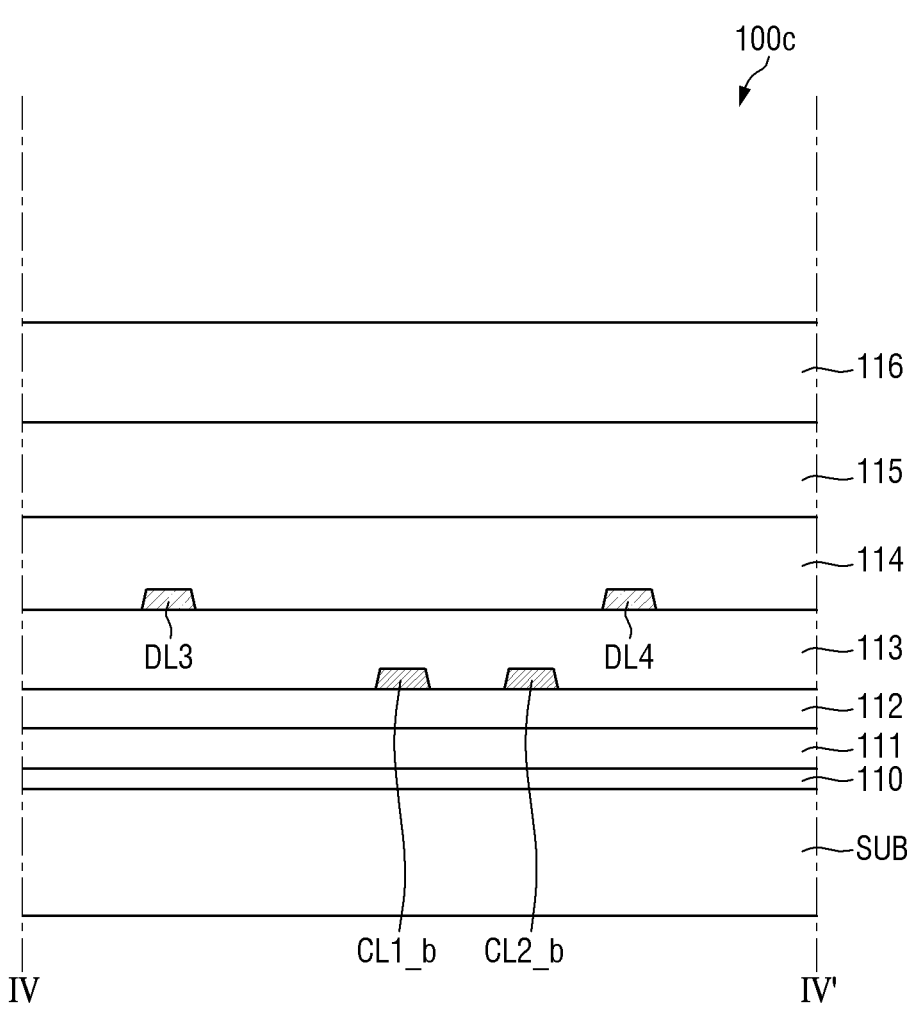
FIG. 21 is a schematic cross-sectional view illustrating an embodiment of the display panel taken along line IV-IV' of FIG. 13 according to still another embodiment.

FIG. 21 is a schematic cross-sectional view illustrating an embodiment of the display panel taken along line IV-IV' of FIG. 13 according to still another embodiment.

Referring to the schematic cross-sectional view of the display panel 100c according to still another embodiment of FIG. 21, the embodiment is different from the embodiment of FIG. 16 in that because the second portion CL1_b of the first connection line CL1 and the second portion CL2_b of the second connection line CL2 are disposed to be spaced apart from each other in the horizontal direction on the second insulating layer 112, and the third data line DL3 and the fourth data line DL4 are disposed to be spaced apart from each other in the horizontal direction on the third insulating layer 113, the second portion CL1_b of the first connection line CL1 and the second portion CL2_b of the second connection line CL2 may be disposed lower than the third data line DL3 and the fourth data line DL4.

The arrangement of the data lines DL and connection lines CL according to FIGS. 15 to 21, and the number of the data lines DL and the connection lines CL, whether or not the data lines DL and the connection lines CL overlap each other, and the degree of overlap between the data lines DL and the connection lines CL may be changed.

Even in the embodiments according to FIGS. 17 to 21, as in the embodiments according to FIGS. 15 and 16, since the first connection line CL1 and the first data line DL1 and the third data line DL3 adjacent to each other are disposed on different layers, it may be possible to bypass the first concave portion G1 while preventing the first connection line CL1 from contacting the first data line DL1 and the third data line DL3.

Accordingly, by disposing the connection lines CL on a different layer from the data lines DL adjacent to each other, it may be possible to prevent the contact with the data lines DL adjacent to each other and electrically connect the disconnected data lines DL disposed on the edge portion EG, and as a result, the image may be provided to the user even from the edge portion EG.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
a substrate including:
a main portion;
a first edge portion protruding from the main portion in a first direction; and
a second edge portion protruding from the main portion in the first direction and spaced apart from the first edge portion in a second direction;
a first data line including:
a first portion disposed on the first edge portion and extending in the second direction; and
a second portion disposed on the second edge portion and extending in the second direction;
a second data line including:
a third portion disposed on the first edge portion and extending in the second direction; and
a fourth portion disposed on the second edge portion and extending in the second direction;
a third data line disposed on the main portion and extending in the second direction;
a first connection line electrically connecting the first portion of the first data line and the second portion of the first data line to each other;

a second connection line electrically connecting the third portion of the second data line and the fourth portion of the second data line to each other; and
a fourth data line disposed on the main portion, extending in the second direction and on a common layer adjacent to the third data line in the first direction such that no data line is between the third and fourth data lines in the first direction, wherein
the first connection line is disposed on a different layer from the first and second portions of the first data line and the third data line,
the second connection line is disposed on a different layer from the third and fourth portions of the second data line,
the first connection line overlaps the third data line in a thickness direction,
the second connection line overlaps the third data line in the thickness direction, and
a portion of the first connection line extending in the second direction and a portion of the second connection line extending in the second direction are disposed between the third data line and the fourth data line along the first direction in a plan view.
2. The display device of claim 1, wherein
the main portion includes:
a first flat portion;
a second flat portion spaced apart from the first flat portion in the second direction, and
a folding portion disposed between the first flat portion and the second flat portion,
the third data line is continuously disposed on the main portion.
3. The display device of claim 2, wherein
the first connection line includes:
a first portion extending in a third direction intersecting the first direction and the second direction;
a second portion extending in the second direction from an end portion of the first portion of the first connection line; and
a third portion extending from an end portion of the second portion of the first connection line in a fourth direction intersecting the first direction and the second direction,
the first portion of the first connection line is electrically connected to the first portion of the first data line, and
the third portion of the first connection line is electrically connected to the second portion of the first data line.
4. The display device of claim 3, wherein
the first portion of the first connection line is disposed on the first edge portion and the first flat portion,
at least a portion of the second portion of the first connection line is disposed on the folding portion, and
the third portion of the first connection line is disposed on the second flat portion and the second edge portion.
5. The display device of claim 2, wherein the folding portion does not interfere with the first edge portion and the second edge portion in case that the substrate is in-folded.
6. The display device of claim 2, wherein
the substrate further includes:
a third edge portion spaced apart from the first edge portion in the first direction; and
a fourth edge portion spaced apart from the second edge portion in the first direction,
the first flat portion is disposed between the first edge portion and the third edge portion, and
the second flat portion is disposed between the second edge portion and the fourth edge portion.

7. The display device of claim 6, wherein in case that the substrate is in-folded, the first flat portion, the second flat portion, and the folding portion are not exposed to the outside, and the first edge portion, the second edge portion, the third edge portion, and the fourth edge portion are exposed to the outside.

8. The display device of claim 6, wherein in case that the substrate is out-folded, the first flat portion, the second flat portion, the folding portion, the first edge portion, the second edge portion, the third edge portion, and the fourth edge portion are exposed to the outside.

9. The display device of claim 1, further comprising:

a pixel disposed on the substrate and including:

a first electrode;

a second electrode overlapping at least a portion of the first electrode in the thickness direction; and a light emitting layer disposed between the first electrode and the second electrode;

a thin film transistor electrically connected to the first electrode by a first connection electrode; and a first insulating layer, a second insulating layer, and a third insulating layer, each disposed between the substrate and the first electrode, wherein the first portion of the first data line and the second portion of the first data line are disposed on the third insulating layer.

10. The display device of claim 9, wherein the first connection line and the first electrode are disposed on the first insulating layer, and the first connection line and the first electrode include a same material.

11. The display device of claim 9, wherein the first connection line and the first connection electrode are disposed on the second insulating layer, and the first connection line and the first connection electrode include a same material.

12. The display device of claim 11, further comprising:

a second connection electrode and a third connection electrode disposed on the second insulating layer, wherein the first connection line is electrically connected to the first data line through the second connection electrode and the third connection electrode.

13. The display device of claim 9, further comprising:

an electrode layer overlapping a gate electrode of the thin film transistor in the thickness direction; and a fourth insulating layer disposed between the gate electrode and the electrode layer.

14. The display device of claim 13, wherein the first connection line is disposed on the fourth insulating layer, and the first connection line and the electrode layer include a same material.

15. A display device comprising:

a substrate including:

a first flat portion;

a second flat portion spaced apart from the first flat portion in a second direction intersecting a first direction;

a folding portion disposed between the first flat portion and the second flat portion;

a first edge portion protruding from the first flat portion in the first direction; and a second edge portion protruding from the second flat portion in the first direction and spaced apart from the first edge portion in the first second direction;

a first data line including:

a first portion disposed on the first edge portion and extending in the second direction; and a second portion disposed on the second edge portion and extending in the second direction;

a second data line including:

a third portion disposed on the first edge portion and extending in the second direction; and a fourth portion disposed on the second edge portion and extending in the second direction;

a third data line continuously disposed on the first flat portion, the folding portion, and the second flat portion and extending in the second direction;

a first connection line electrically connecting the first portion of the first data line and the second portion of the first data line to each other;

a second connection line electrically connecting the third portion of the second data line and the fourth portion of the second data line to each other; and a fourth data line continuously disposed on the first flat portion, the folding portion, and the second flat portion and extending in the second direction;

wherein the fourth data line and the third data line are on a common layer and adjacent to each other in the first direction such that no data line is between the third and fourth data lines in the first direction, the first connection line overlaps the third data line in the first flat portion and the second flat portion in a thickness direction, the first connection line does not overlap the third data line in the folding portion in the thickness direction, the second connection line overlaps the third data line in the thickness direction, and a portion of the first connection line extending in the second direction and a portion of the second connection line extending in the second direction are disposed between the third data line and the fourth data line along the first direction in a plan view.

16. The display device of claim 15, wherein the first connection line is disposed on a different layer from the third data line and the first and second portions of the first data line.

17. The display device of claim 15, wherein the first connection line and the second connection line are disposed on a same layer, and the first connection line and the second connection line are disposed on different layers from the first and second portions of the first data line, the third and fourth portions of the second data line, the third data line, and the fourth data line.

18. The display device of claim 15, wherein in the first flat portion and the second flat portion, each of the first connection line and the second connection line overlap at least one of the third data line and the fourth data line in the thickness direction.

19. The display device of claim 15, wherein in the folding portion, the third data line, the first connection line, the second connection line, and the fourth data line do not overlap each other in the thickness direction.

* * * * *